(12) United States Patent
Jung

(10) Patent No.: US 7,777,855 B2
(45) Date of Patent: Aug. 17, 2010

(54) THIN FILM TRANSISTOR SUBSTRATE HAVING GATE SHORTING LINE AND GATE SHORTING BAR CONNECTION AND FABRICATING METHOD THEREOF

(75) Inventor: Ji Hyun Jung, Ulsan (KR)

(73) Assignee: LG. Display Co., Ltd., Seoul (KR)

( * ) Notice: Subject to any disclaimer, the term of this patent is extended or adjusted under 35 U.S.C. 154(b) by 305 days.

(21) Appl. No.: 11/478,805

(22) Filed: Jun. 30, 2006

(65) Prior Publication Data

US 2007/0164289 A1 Jul. 19, 2007

(30) Foreign Application Priority Data

Dec. 30, 2005 (KR) .................. 10-2005-0135044

(51) Int. Cl.
*G02F 1/1345* (2006.01)

(52) U.S. Cl. .............. 349/149; 349/151; 349/152; 349/192
(58) Field of Classification Search .......... 349/149, 349/151, 152, 192
See application file for complete search history.

(56) References Cited

U.S. PATENT DOCUMENTS 6,128,051 A * 10/2000 Kim et al. ............. 349/40
6,184,948 B1 * 2/2001 Lee ..................... 349/54

* cited by examiner

*Primary Examiner*—Michael H Caley
(74) *Attorney, Agent, or Firm*—Brinks Hofer Gilson & Lione

(57) ABSTRACT

A thin film transistor substrate and a fabricating method that includes an opening hole that separates a gate shorting line connected to a gate shorting bar used upon a lighting-inspecting of a gate line into an odd and an even gate shorting line is provided.

2 Claims, 29 Drawing Sheets

THIN FILM TRANSISTOR SUBSTRATE HAVING GATE SHORTING LINE AND GATE SHORTING BAR CONNECTION AND FABRICATING METHOD THEREOF

This application claims the benefit of Korean Patent Application No. P2005-135044 filed in Korea on Dec. 30, 2005, which is hereby incorporated by reference.

BACKGROUND

1. Field

A thin film transistor array substrate and a fabricating method thereof are provided.

2. Related Art

A display device is desired as a visual information communicating media in information society. Various flat panel display devices have been developed that are reduced in weight and bulk. These devices have generally replaced the cathode ray tube. Conventionally, the cathode ray tube is large in size and bulky.

Such flat panel display devices include, for example, a liquid crystal display device (LCD), a field emission display (FED), a plasma display panel (PDP) and an electro-luminescence (EL), etc.

The liquid crystal display device satisfies a thin-thickness and a light-weight trend and improves productivity to rapidly replace the cathode ray tube in many application fields.

Particularly, a liquid crystal display device of an active matrix type that drives a liquid crystal cell using a thin film transistor (hereinafter, TFT) has an advantage of a high picture quality and a small power. There has been rapid development toward a scale-up and a high-resolution device due to a mass production technique security and the result of research and development.

A method of fabricating a liquid crystal display device of the active matrix type is classified into, for example, a substrate cleaning, a substrate patterning process, an alignment forming/rubbing process, a substrate joining/liquid crystal injecting process, a packing process, an inspecting process, and a repairing process.

The substrate cleaning process removes an impurity contaminated on a substrate surface of the liquid crystal display device using a cleaning solution.

The substrate patterning process is divided into a patterning of an upper substrate (a color filter array substrate) and a patterning of a lower substrate (a TFT-array substrate). A color filter, a common electrode and a black matrix, are formed on the upper substrate. A signal wiring such as a data line and a gate line is formed on the lower substrate. The TFT is formed at an intersection area of the data line and the gate line. A pixel electrode connected to the TFT is formed at a pixel area between the data line and the gate line.

In the alignment forming/rubbing process, an alignment film is coated on each upper substrate and lower substrate, and the alignment film is rubbed by a rubbing patch.

In the substrate joining/liquid crystal injecting process, the upper substrate and the lower substrate are joined to each other by a sealant, and a liquid crystal and a spacer are injected through a liquid crystal injection port. The liquid crystal injection port is sealed.

In the packing process of a liquid crystal display panel, a tape carrier package (hereinafter, TCP) packed an integrated circuit a gate drive integrated circuit and a data drive integrated circuit is connected to a pad portion on the substrate. The drive integrated circuit can be directly packed on the substrate by a Tape Automated Bonding type using the above-mentioned TCP and a Chip On Glass (hereinafter, COG) type.

The inspecting process includes an electric lightning inspection processed after a variety of signal wirings and a pixel electrode is formed on the lower substrate, and a quality inspection of each pixel.

The repairing process operates a restoration about a substrate proved such that a repairing is enabled by the inspecting process. A low-quality substrate that is non-repaired in the inspecting process is disposed.

FIG. 1 is a diagram that explains a lighting inspection using a short bar of a related art thin film transistor substrate.

Referring to FIG. 1, a thin film transistor substrate 30 includes a display area 10 with a liquid crystal cell arranged in a matrix type, and a non-display area 20 that includes the area other than the display area 10.

The display area 10 of the thin film transistor substrate 30 is comprised of gate lines supplied with a gate signal from a gate pad 22. Data lines are supplied with a data signal from a data pad 25. A thin film transistor switches the liquid crystal cell at the intersection of the gate lines and the data lines. A pixel electrode is connected to the thin film transistor to drive the liquid crystal cell. A lower alignment film is coated thereon in order to align the liquid crystal.

The non-display area 20 of the thin film transistor substrate 30a comprises a gate pad 22 that applies a gate signal. Gate shorting bar 24 is commonly connected to a gate shorting line 23 consisted of an odd and even shorting line 23a and 23b extended from the gate pad 22. A data pad 25 applies a gate signal and a data shorting bar 27 is commonly connected to a data shorting line 26 that consist of odd and even shorting lines 26a and 26b that extend from the data pad 25.

The gate shorting bar 24 and the data shorting bar 27 are positioned at the non-display area 20 of the thin film transistor substrate 30 that is used upon lighting inspecting (or "on-off inspection") of the liquid crystal cell after the liquid crystal display panel is completed.

Referring to a dotted line area A shown in FIG. 2, in the gate shorting bar 24 formed on a related art thin film transistor substrate, the odd and the even shorting line 23a and 23b are commonly connected to the gate shorting bar 24.

In other words, since the same inspection signal is applied via the gate shorting bar 24 formed on the thin film transistor substrate, then a possibility of shorting the gate line can not be inspected. After the liquid crystal display panel is finally completed, the inspection signal is applied to each gate pad 22 using a separate auto-probe means to inspect the quality.

Accordingly, since the quality is inspected by a separate auto-probe inspecting process after the liquid crystal display panel is finally completed, the cost is increased, and the process used to inspect the gate line consisting of a related art thin film transistor substrate is complicated.

SUMMARY

A thin film transistor substrate comprises gate lines formed on a substrate. Data lines cross the gate lines with a gate insulating film therebetween. A thin film transistor is formed at intersection of the gate line and the data line. A protective film covers a thin film transistor formed on the gate insulating film. A pixel electrode is connected, via a contact hole that passes through the protective film, to the thin film transistor. Gate shorting bars are connected to an odd and an even gate shorting line extended from a gate pad connected to the gate line. An open hole that separates one of the odd and the even gate shorting lines from the gate shorting bar.

The thin film transistor substrate further comprises a data shorting bar connected to an odd and an even data shorting line extended from a data pad connected to the data line.

A shorting bar consists of the thin film transistor substrate that includes a first gate shorting bar connected to a gate shorting line not separated by an open hole. A second gate shorting bar connected to a gate shorting line separated by an open hole, wherein the second gate shorting bar is electrically connected, via a contact hole formed on a protective film, to the shorted gate shorting line.

The first shorting bar and the gate shorting line consists of the thin film transistor substrate are formed of the same metal as the gate line, and formed in a crossed image.

The second shorting bar consists of the thin film transistor substrate is formed of the same metal as the data line, and formed in an image crossed with the gate shorting line with having the gate insulating film therebetween.

The protective film consists of the thin film transistor substrate includes a first contact hole that passes through the protective film to contact the drain electrode of the thin film transistor with the pixel electrode. A second contact hole passes through the protective film and the gate insulating film to contact a lower electrode of the gate pad with an upper electrode. A third contact hole passes through the protective film to contact a lower electrode of the data pad with an upper electrode. A fourth contact hole passes through the protective film and the gate insulating film to contact a second shorting bar with the shorted gate shorting line.

The open hole consists of the thin film transistor substrate is formed by a photolithography process using a mask.

A method of fabricating a thin film transistor substrate comprises forming gate lines on a substrate; forming data lines crossing the gate line with having a gate insulating film therebetween; forming a thin film transistor at an intersection of the gate line and the data line; forming a protective film for covering a thin film transistor formed on a gate insulating film; forming a pixel electrode connected, via a contact hole passing through the protective film, to the thin film transistor; forming gate shorting bars connected to an odd and an even gate shorting line extended from a gate pad connected to the gate line; and forming an open hole for separating one of the odd and the even gate shorting line from the gate shorting bar.

A method of fabricating a thin film transistor substrate, comprising forming a first conductive pattern including gate lines, a gate electrode connected to the gate lines and a first gate shorting bar connected to the odd gate shorting line among the gate shorting lines extended from a lower gate pad electrode connected to the gate line on a substrate; forming a gate insulating film on a substrate provided with the first conductive pattern; forming a semiconductor layer for forming a channel and a second conductive pattern including data lines, a source/drain pattern connected to the data lines, a data shorting bar connected to a data shorting line extended from a lower data pad connected to the data line and a second gate shorting bar connected to the even gate shorting lines extended from the lower gate pad electrode on the gate insulating film; forming a protective film on a gate insulating film provided with the semiconductor layer and the second conductive pattern; forming a contact hole for exposing the drain electrode, the lower gate pad electrode, the lower data pad electrode and the even gate shorting lines and open hole area for separating the even gate shorting lines from the first gate shorting bar on the protective film; and after a transparent conductive layer is entirely formed on the protective film, forming an open hole for separating the even gate shorting lines, a semiconductor pattern for forming a channel and a third conductive pattern including a source electrode connected to the data lines, a drain electrode opposed to a source electrode having the channel therebetween, a pixel electrode connected to the drain electrode, an upper gate pad electrode and an upper data pad electrode.

DRAWINGS

The following detailed description will make reference to the accompanying drawings.

DESCRIPTION

Hereinafter, the preferred embodiments will be described in detail with reference to the accompanying drawings.

Figure 1:
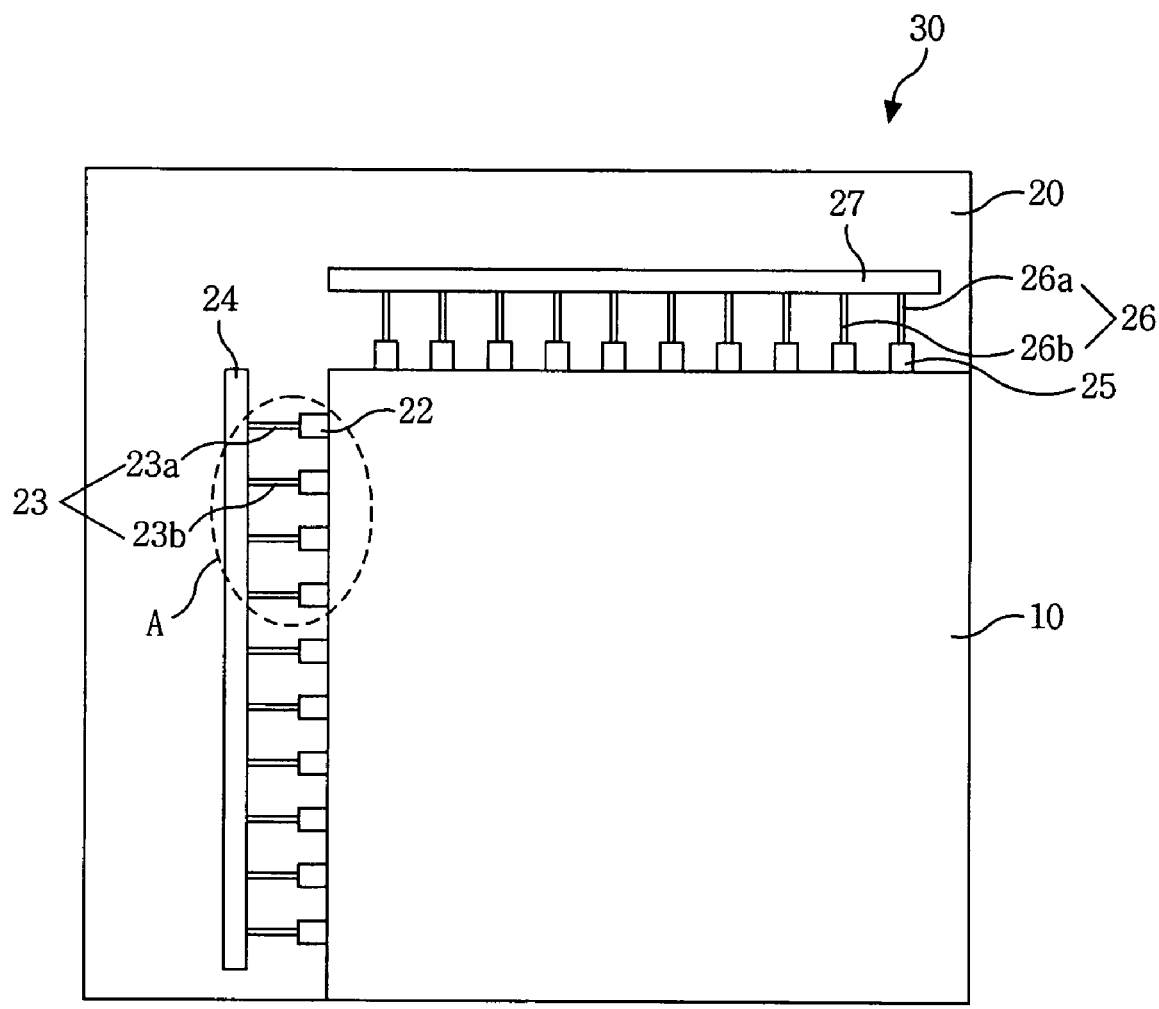
FIG. 1 is a diagram that explains a lighting inspection of a gate line using a gate shorting bar of a related art thin film transistor substrate.
Figure 2:
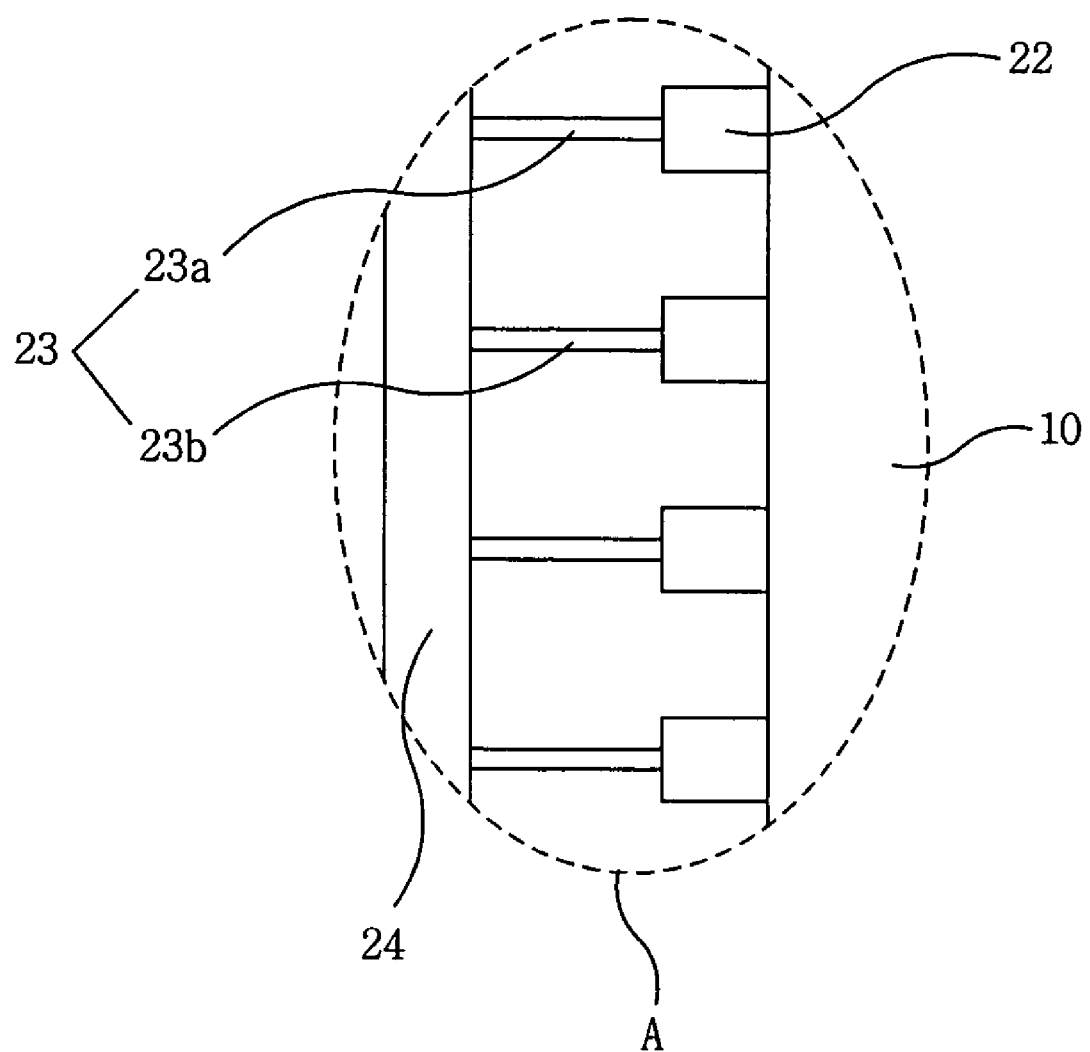
FIG. 2 is a magnification diagram of an area where an even and an odd shorting line is simultaneously connected to a gate shorting bar in FIG. 1.
Figure 3:
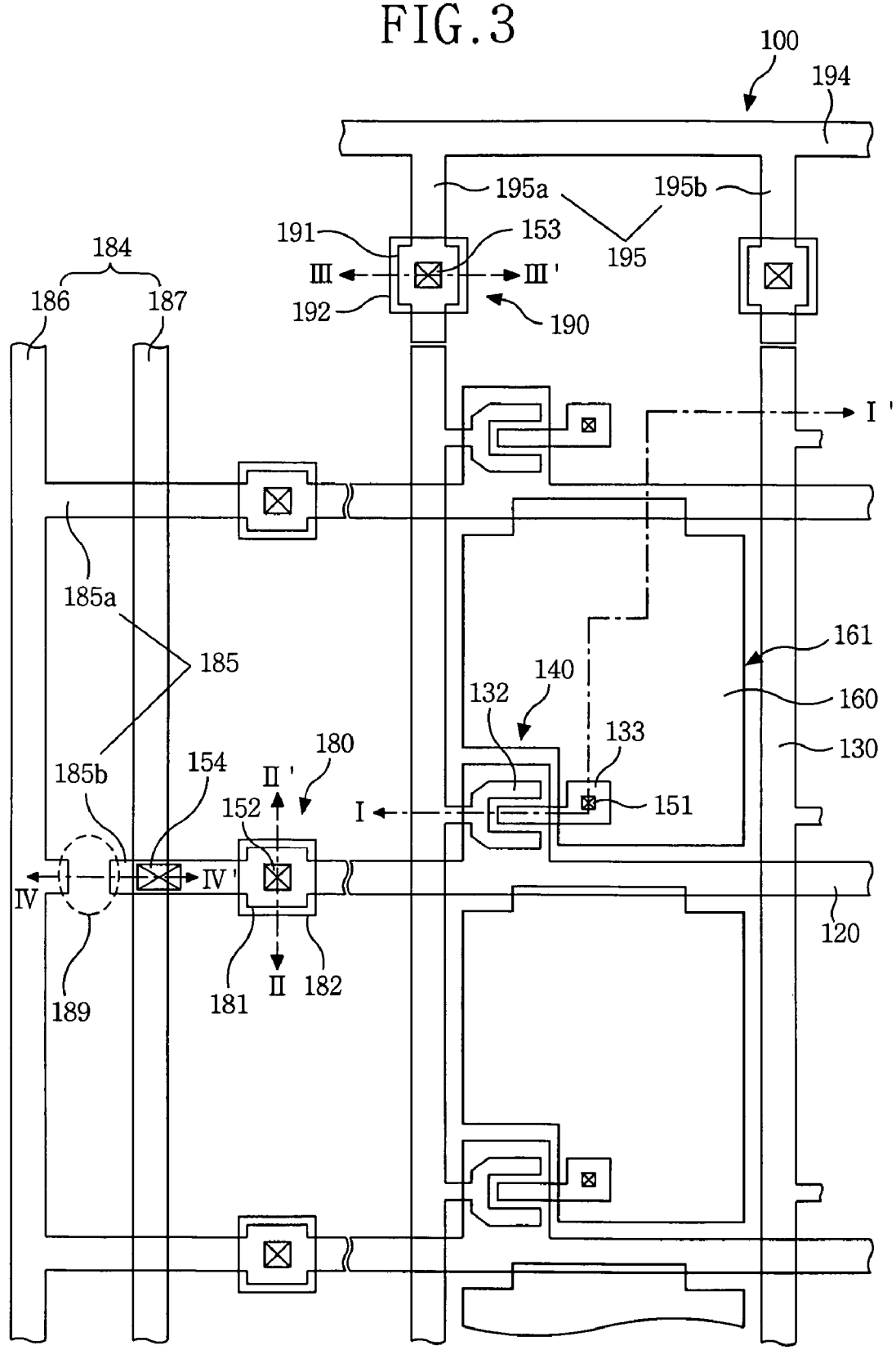
FIG. 3 is a plan view that shows a thin film transistor substrate.
Figure 4:
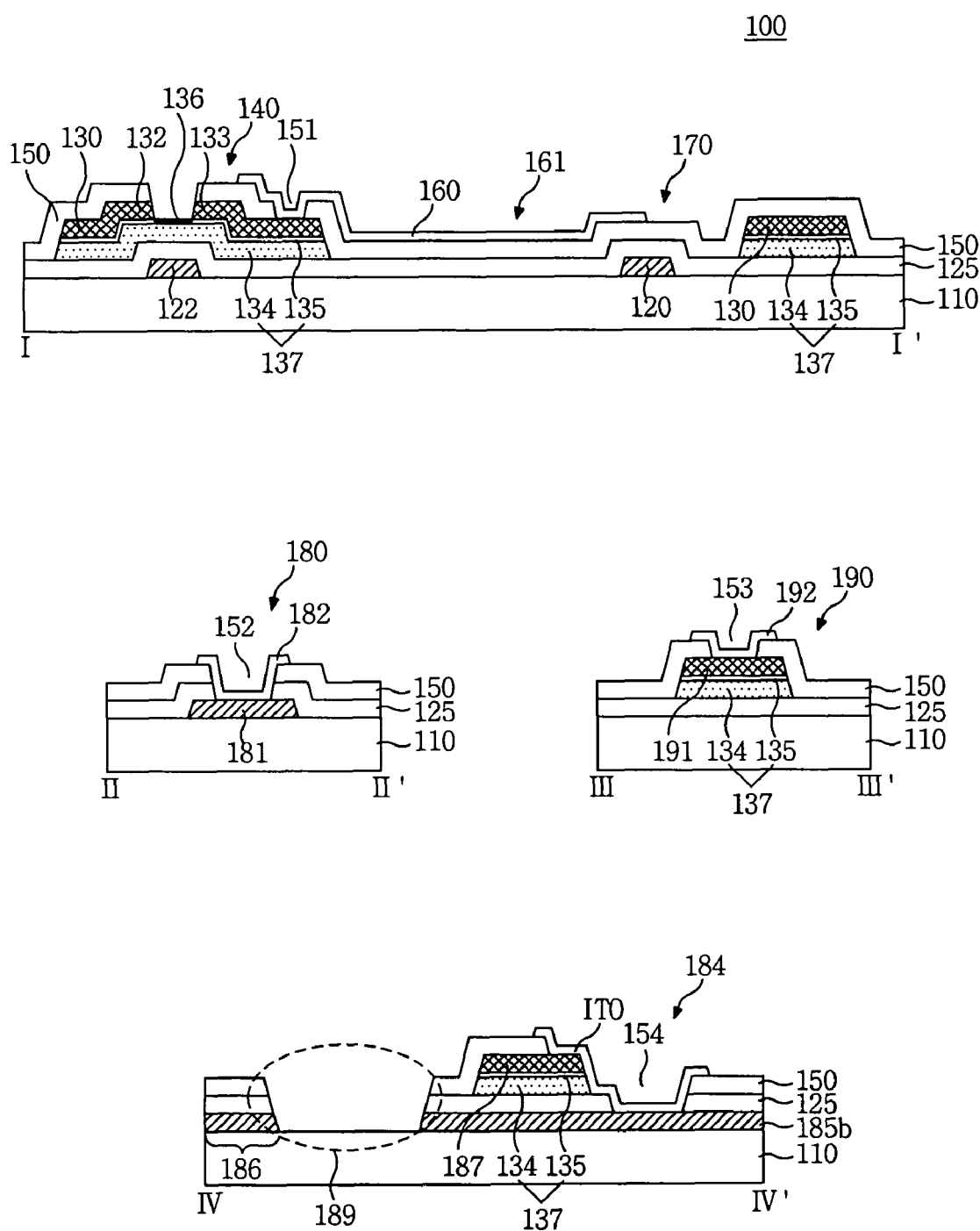
FIG. 4 is a sectional view of the thin film transistor substrate taken along the I-I', II-II', III-III line in FIG. 3.

As shown in FIG. 3 and FIG. 4, the thin film transistor substrate includes a gate line 120 formed on a substrate 110. A data line 130 crosses the gate line to define a pixel area having a gate insulating film 125 therebetween. A thin film transistor 140 is formed at an intersection of the gate line and the data line. A protective film 150 covers a thin film transistor formed on a gate insulating film. A pixel electrode 160 is connected, via a contact hole passing through the protective film, to thin film transistor 140. A storage capacitor 170 is formed at an overlapping area of the gate line and the pixel electrode, a gate pad 180 is connected to the gate line and a data pad 190 is connected to the data line.

A thin film transistor 100 further includes a gate shorting bar 184 and a data shorting bar 194 that implements a shorting inspection of the gate line and the data line.

The gate line 120 transmits a gate signal supplied from a gate driver (not shown) that is connected to the gate pad 180 into the gate electrode 122 that consists of a thin film transistor 140.

Herein, a metal is formed of, for example, Cr, MoW, Cr/Al, Cu, Al(Nd), Mo/Al, Mo/Al(Nd), Cr/Al(Nd).

The data line 130 assists in transmitting a data signal supplied from a data driver (not shown) connected to the data pad 190 into the source electrode 132 and the drain electrode 133 consisting of the thin film transistor 140 linking with an on/off of the gate electrode 122.

The data line 130 is formed of a metal having a strong corrosion property, for example, a molybdenum Mo, a Chrome Cr, a Titanium Ti and a Tantalum Ta, etc.

The thin film transistor 140 allows a pixel signal of the data line 130 in response to a gate signal of the gate line 120 to be charged into the pixel electrode 160 and includes the gate electrode 122 connected to the gate line 120. The source electrode 132 is connected to the data line 130. The drain electrode 133 is opposed to the source electrode 132 with having a channel therebetween, and connected, via a first contact hole 151 passing through the protective film 150, to the pixel electrode 160.

The thin film transistor 140 is overlapped with the gate electrode 122 with the gate insulating film 125 therebetween. The thin film transistor further includes a semiconductor layer consisting of an active layer 134 that forms a channel with the source electrode 132 and the drain electrode 133 therebetween and an ohmic contact layer 135.

The active layer 134 overlaps with the data line 130 and a lower data pad electrode 191. The ohmic contact layer 135 for making an ohmic contact with the source electrode 132, the drain electrode 133 and the lower data pad electrode 191 is further formed on the active layer 134.

A channel protective film 136 is formed of SiOx or SiNx is further formed on the active layer 134 in order to protect a channel from an exterior environment.

The channel protective film 136 protects the active layer 134 that forms a channel from a stripping process and the cleaning process that removes a photo-resist pattern used upon forming of the source electrode 132, the drain electrode 133 and the pixel electrode 160.

The protective film 150 covers the thin film transistor 140 formed on the gate insulating film 125 and protects the active layer 134 and a pixel area 161 that forms a channel from dampness or a scratch generated upon processing of a next process.

The protective film 150 made from an inorganic insulating, for example, SiNx, or an organic insulating material, for example, an acrylic organic compound, BCB (benzocyclobutene) or PFCB (perfluorocyclobutane) is disposed on the gate insulating film 125 by a deposition technique, for example, the PECVD or the sputtering.

First to fourth contact holes 151, 152, 153 and 154 are formed on the protective film 150 by the photolithography process using a mask. The first contact hole 151 passes through the protective film 150 to expose the drain electrode 133. The second contact hole 152 passes through the protective film 150 and the gate insulating film 125 to expose the lower gate pad electrode 181. The third contact hole 153 passes through the protective film 150 to expose the lower data pad electrode 191. The fourth contact hole 154 passes through the protective film 150 and the gate insulating film 125 to open a gate shorting line 185.

The pixel electrode 160 is connected, via the first contact hole 151 that passes through the protective film 150, to the drain electrode 133 of the thin film transistor 140 to form at the pixel area 161. An electric field is formed between the pixel electrode 160 that is supplied with a pixel signal via the thin film transistor 140 and the common electrode (not shown) supplied with a reference voltage via the thin film transistor 140.

Liquid crystal molecules are charged between the substrates by the electric field formed between the pixel electrode 160 and the common electrode is rotated due to a dielectric anisotropy. Transmittance of light transmitting the pixel area 161 is differentiated depending upon a rotation extent of the liquid crystal molecules, thereby implementing a gray level scale.

The storage capacitor 170 is formed such that the gate line 120 and the pixel electrode 160 overlap each other with the gate insulating film 125 and the protective film 150 therebetween. The storage capacitor 170 allows a video signal charged in the pixel electrode 160 to be stably maintained until the next signal is charged.

The gate pad 180 is connected to a gate driver (not shown) to supply a gate signal to the gate line 120.

The gate pad includes the lower gate pad electrode 181 that extends from the gate line 102, the second contact hole 152 passes through the gate insulating film 125 and the protective film 150, and the upper gate pad electrode 182 is connected, via the second contact hole 152, to the lower gate pad electrode 181.

The upper gate pad electrode 182 is formed in a protruded shape within the second contact hole 152 and on the gate pad 180 to electrically contact with a designated driving circuit packed on the gate pad 180.

The gate shorting bar 184, after a designated electric signal is supplied to the gate line 120 to apply a stress, is used to perform a shorting inspection MPS of the gate line 120. The gate shorting lines 185a and 185b extended from the lower gate pad electrode 182 consists of the gate pad 180 is electrically connected to the gate shorting bar 184.

The gate shorting bar 184 includes a first gate shorting bar 186 electrically connected to the odd shorting line 185a that extends from the gate pad 180 and a second gate shorting bar 187 electrically connected, via the fourth contact hole 154, to the even shorting line 185b extended from the gate pad 180.

The even shorting line 185b that is connected to the second gate shorting bar 187 is separated from the first gate shorting bar 186 by an open hole 189.

The first gate shorting bar 186 is simultaneously formed on the lower substrate 110 along with the odd and even shorting lines 185a and 185b by a mask process using the same metal as the gate line 125.

The second gate shorting bar 187 is formed in a crossed manner with the odd and even shorting lines 185a and 185b on the gate insulating film 125 by a mask process using the same metal as the data line 130.

The second gate shorting bar 187 is insulated from the odd shorting line 185a by the gate insulating film 125 and is electrically connected, via the fourth contact hole 154 passing through the protective film 150 and the gate insulating film 125, to the even shorting line 185b.

In other words, the odd shorting line 185 and the even shorting line 185b are electrically connected to the first gate shorting bar 186 and the second gate shorting bar 187, so that the lightning inspection can be performed in a real time before the liquid crystal display panel is finally completed.

The data pad 190 is connected to a gate driver (not shown) to supply a data signal to the data line 130.

The data pad 190 includes a semiconductor layer formed on the gate insulating film 125. A lower data pad electrode 191 extends from the data line 130. The third contact hole 153 passes through the protective film 150 and the semiconductor layer and the upper data pad electrode 192 connected, via the third contact hole 153, to the lower data pad electrode 191. The upper data pad electrode 192 is formed in a protruded shape within the third contact hole 153 and on the data pad 190 to electrically contact with a designated driving circuit packed on the data pad 190.

The data shorting bar 194, after a designated electric signal is supplied to the data line 130 to apply a stress, is used to perform a shorting inspection MPS about the data line 130. The date shorting lines 195a and 195b extend from the lower data pad electrode 191 that consists of the data pad 190 is electrically connected to the data shorting bar 194.

A method of fabricating the thin film transistor substrate according to the present invention will be described in detail with reference to the accompanying drawings.

A process that forms a first conductive pattern of the thin film transistor will be described with reference to FIG. 5A and FIG. 5B.

Figure 5A:
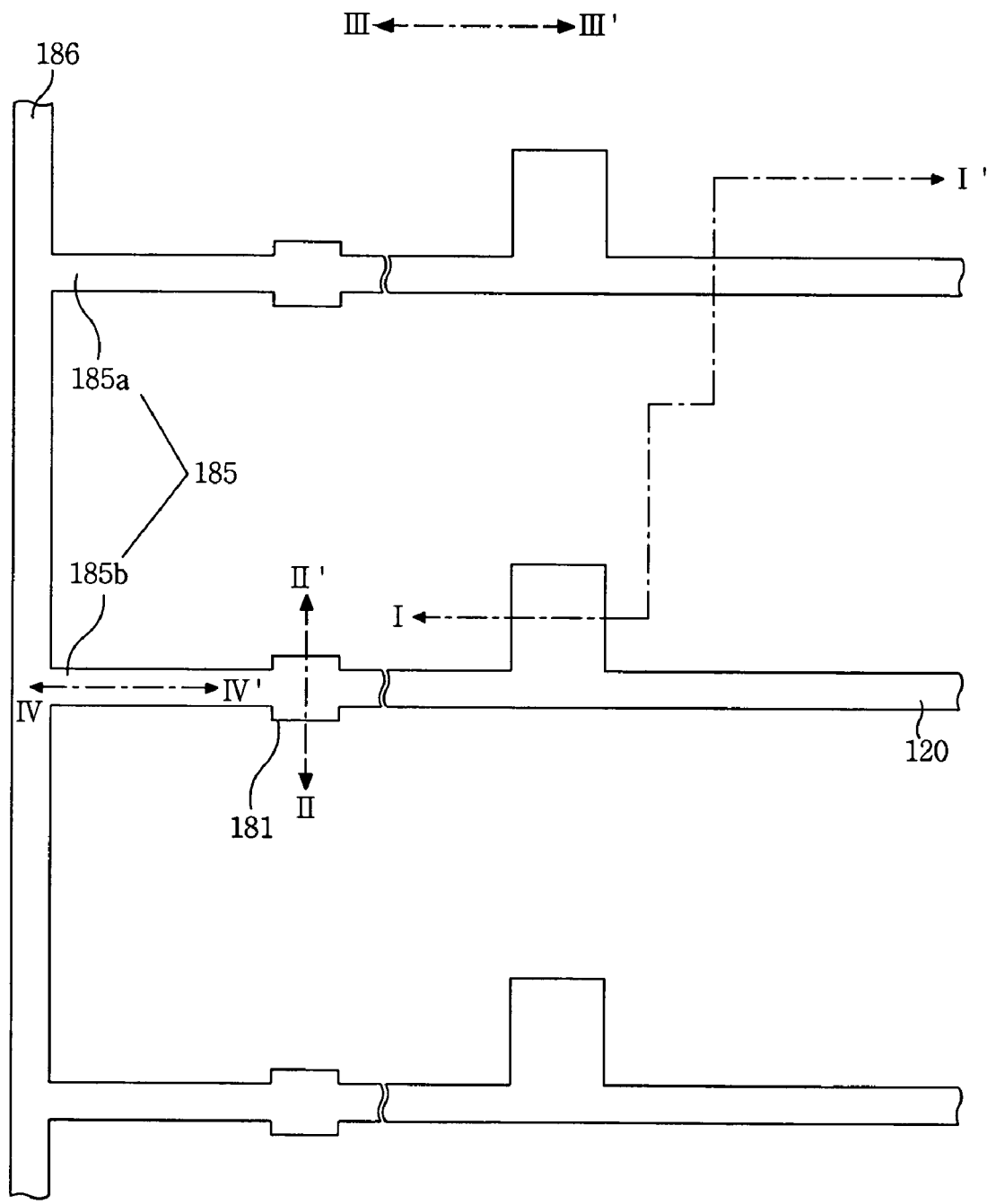
FIG. 5A and FIG. 5B are a plan view and a sectional view that shows a thin film transistor substrate provided with a first conductive pattern.
Figure 5B:
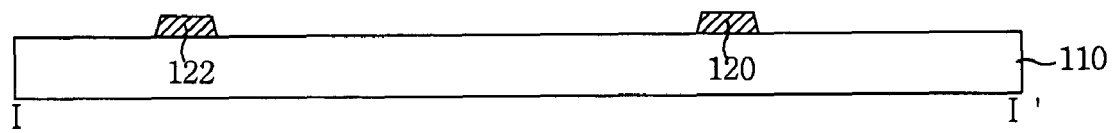
Figure 5B:
Figure 5B:
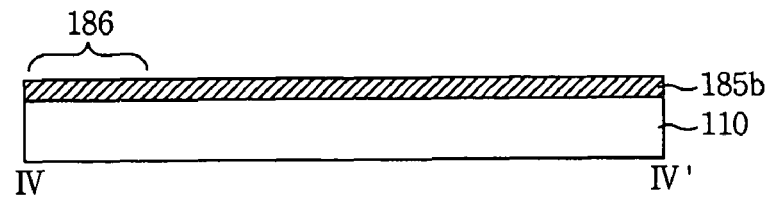

As shown in FIG. 5A and FIG. 5B, a first conductive pattern includes the gate line 120, the gate electrode 122, the lower gate pad electrode 181, the gate shorting line 185b and the first gate shorting bar 186 is formed on the lower substrate 110 by a first mask process.

Figure 6A:
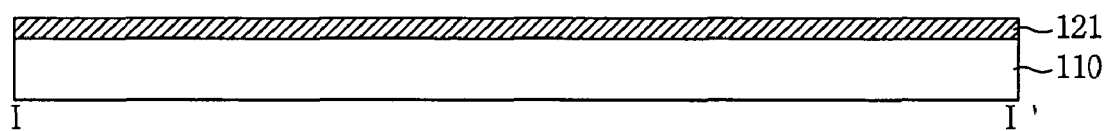
FIG. 6A to FIG. 6C illustrate manufacturing flow charts showing the thin film transistor substrate provided with the first conductive pattern.
Figure 6A:
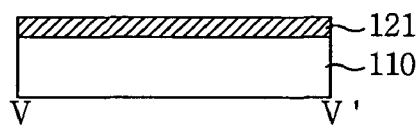
Figure 6A:
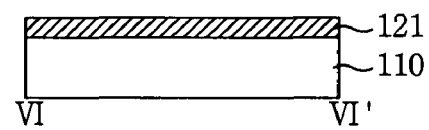
Figure 6A:
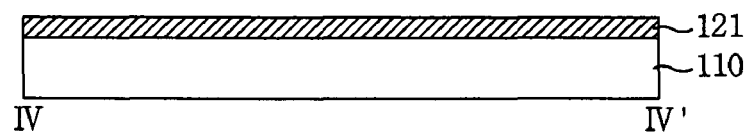

Referring to FIG. 6A, the gate metal layer 121 is formed on the lower substrate 110 by a deposition technique, for example, sputtering. The gate metal layer 121 is formed of, for example, aluminum Al group metal, a Copper Cu, a Chrome Cr or a molybdenum Mo.

If the gate metal layer 121 that forms the first conductive pattern is formed of the aluminum Al group metal, that is, a low resistance wiring, the gate metal layer 121 may have a double-layer structure, for example, AlNd/Mo in order to improve a contact resistance with a transparent conductive film ITO forming the third conductive pattern.

Figure 6B:
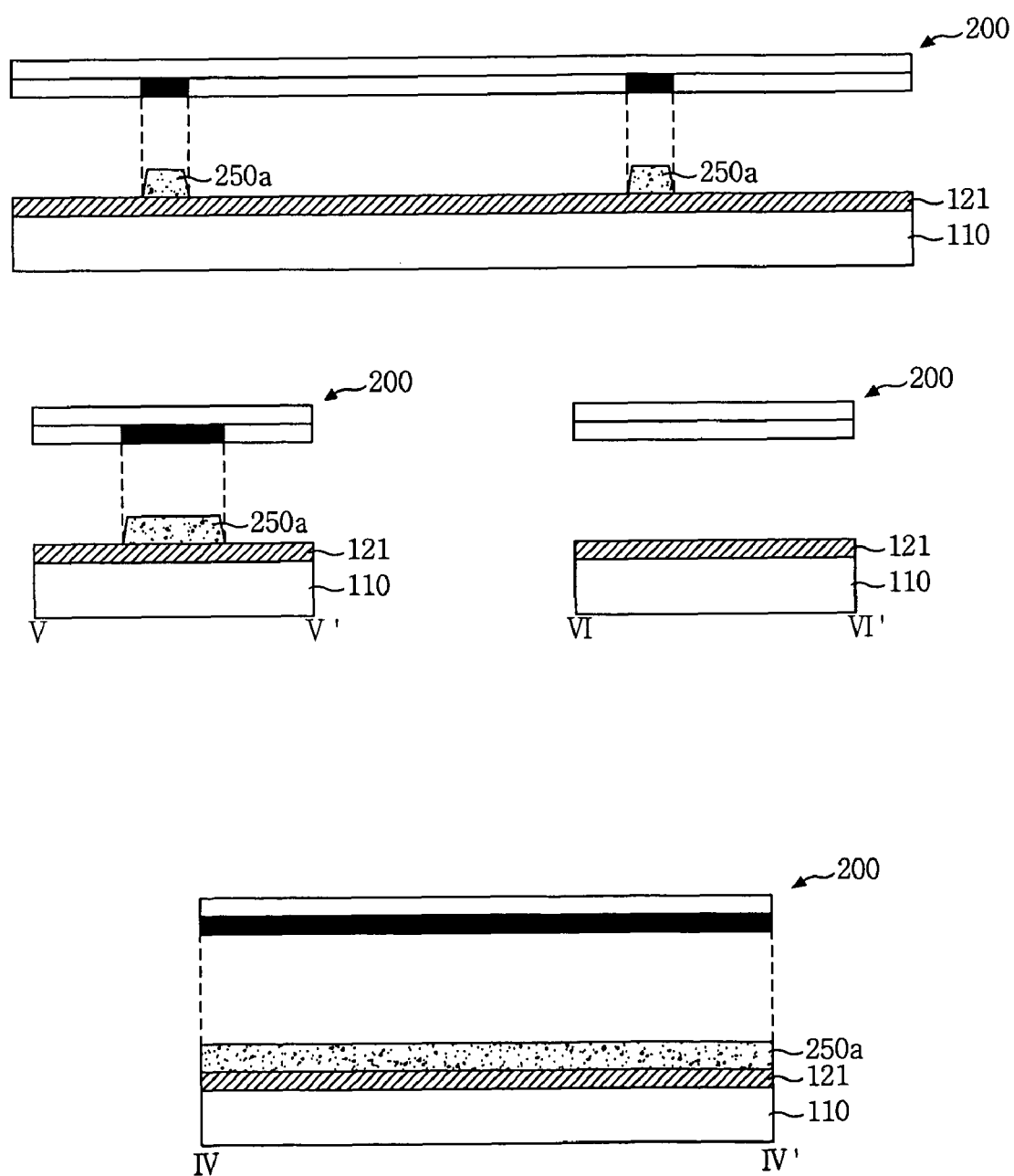

Referring to FIG. 6B, after a photo-resist is coated on the gate metal layer 121, the photolithography process using the first mask 200 is performed to provide a photo-resist pattern 250a on the gate metal layer 121.

Figure 6C:
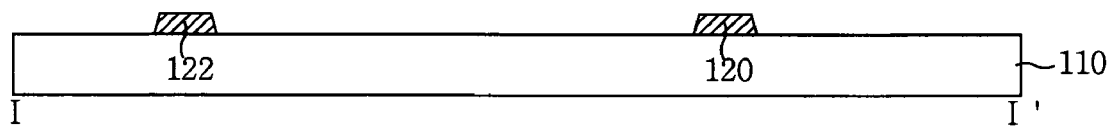
Figure 6C:
Figure 6C:
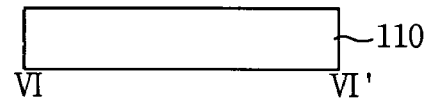
Figure 6C:
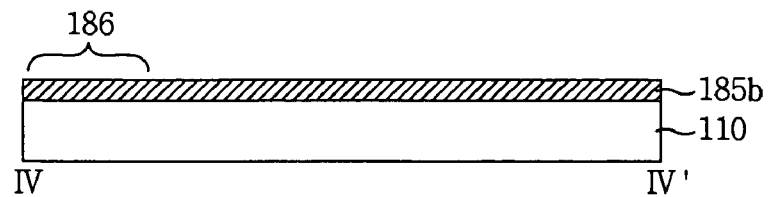

Referring to FIG. 6C, after an wet-etching about the gate metal layer 121 exposed by a photo-resist pattern 250a is carried out, the stripping process about the left photo-resist pattern 250a is carried out to form the first conductive pattern that includes the gate line 120 and the lower gate pad electrode 181. The gate electrode 122 is connected to the gate line 120. The gate shorting line 185b extends from the lower gate pad electrode 181. The first gate shorting bar is electrically connected to the gate shorting line 185b on the lower substrate 110.

The gate shoring line 185 electrically connected to the first gate shorting bar 186 is comprised of the odd and the even shorting lines 185a and 185b. The even shorting line 185b is separated from the first gate shorting bar 186 by the open hole 189.

Figure 7A:
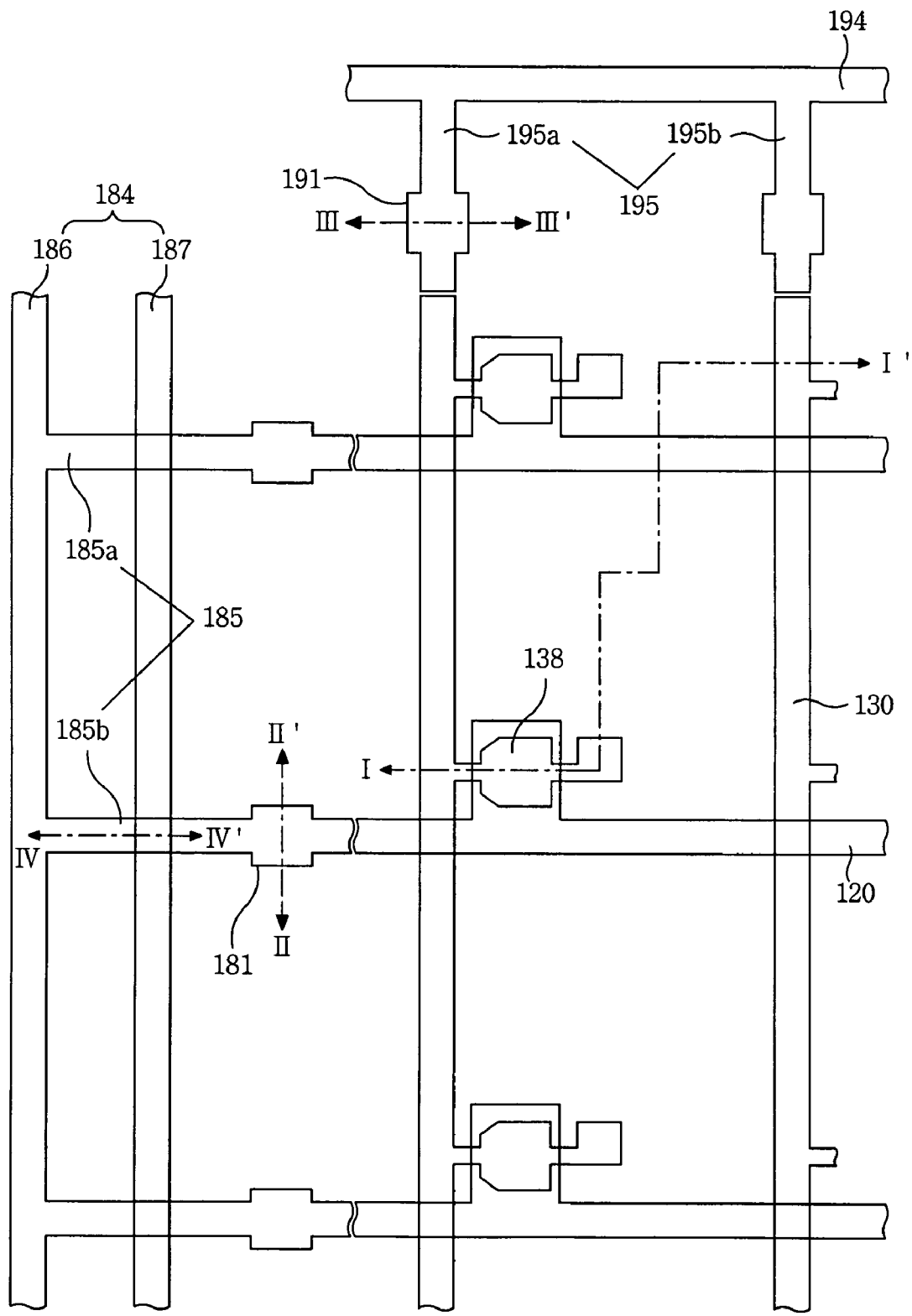
FIG. 7A and FIG. 7B are a plan view and a sectional view that show a thin film transistor substrate provided with a second conductive pattern.
Figure 7B:
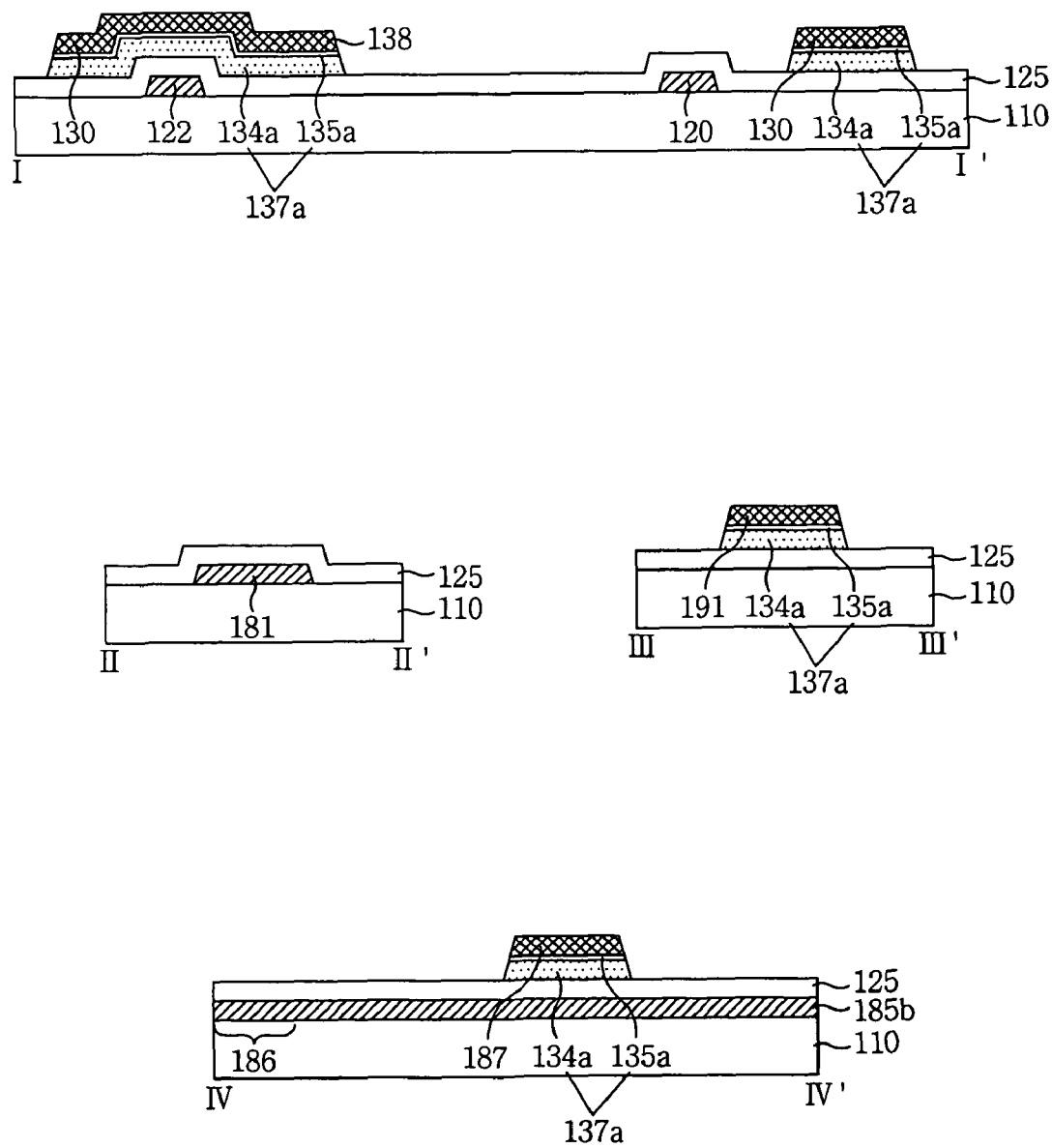

As described above, after the first conductive pattern is formed on the lower substrate, referring to FIG. 7A and FIG. 7B, a semiconductor layer 137a, and the second conductive pattern including the data line 130, a source/drain pattern 138, the lower data pad electrode 191, the data shorting bar 194, the data shorting line 195 and the second gate shorting bar 187 are formed on the gate insulating film 125 covering the first conductive pattern by the second mask process.

Figure 8A:
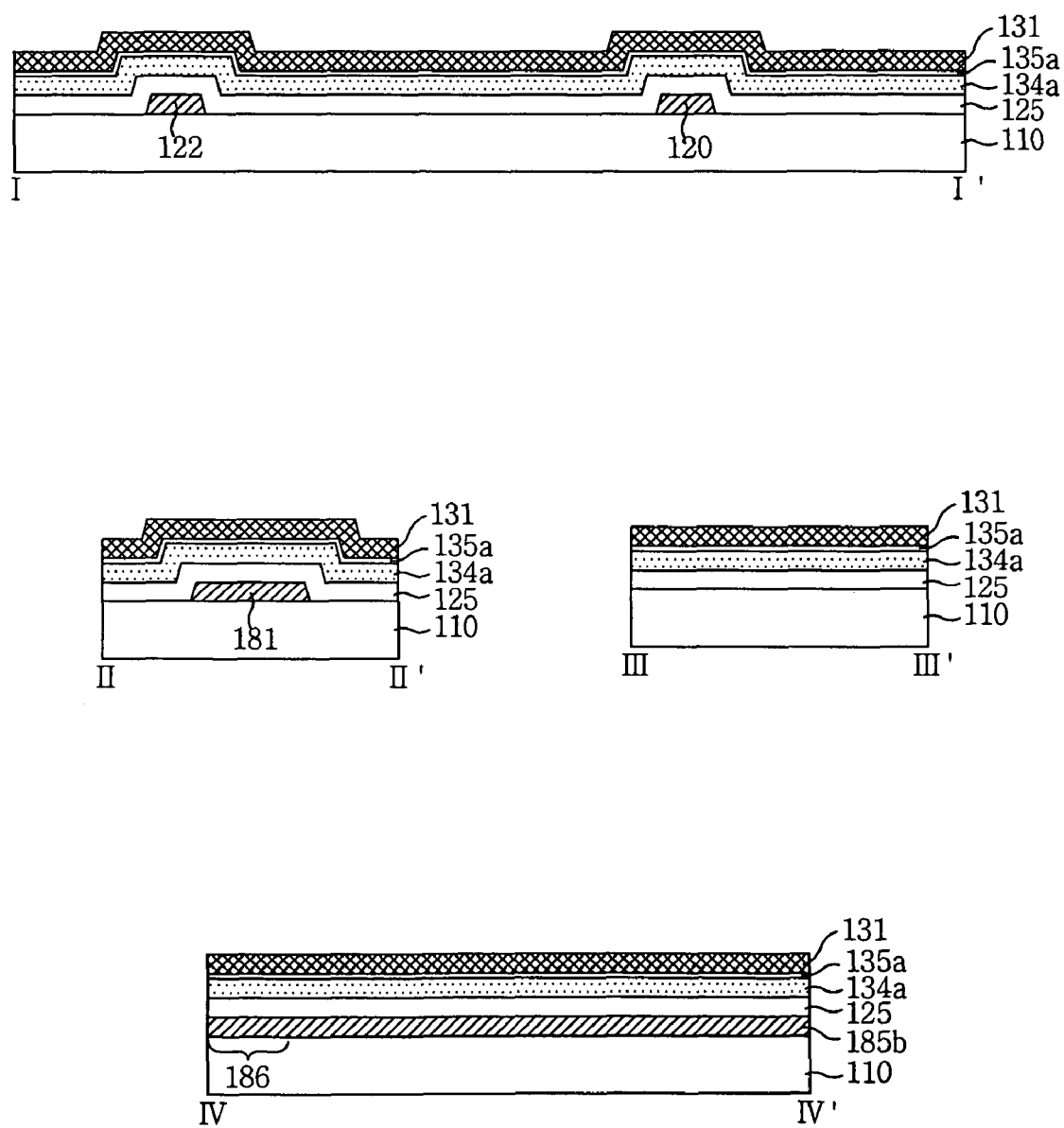
FIG. 8A to FIG. 8D are manufacturing flow charts that show the thin film transistor substrate provided with the second conductive pattern.

Referring to FIG. 8A, the gate insulating film 125, an amorphous silicon layer 134a, an amorphous silicon layer 135a doped with an n⁺ impurity and the data metal layer 131 are sequentially disposed on the substrate 110 provided with the first conductive pattern by a deposition technique, for example, the PECVD or the sputtering.

Herein, the gate insulating film 125 made from an inorganic insulating, for example, SiOx or SiNx, and the data metal layer 131 is formed of, for example, a molybdenum Mo, a Titanium Ti, a Tantalum Ta and a Mo-alloy.

Figure 8B:
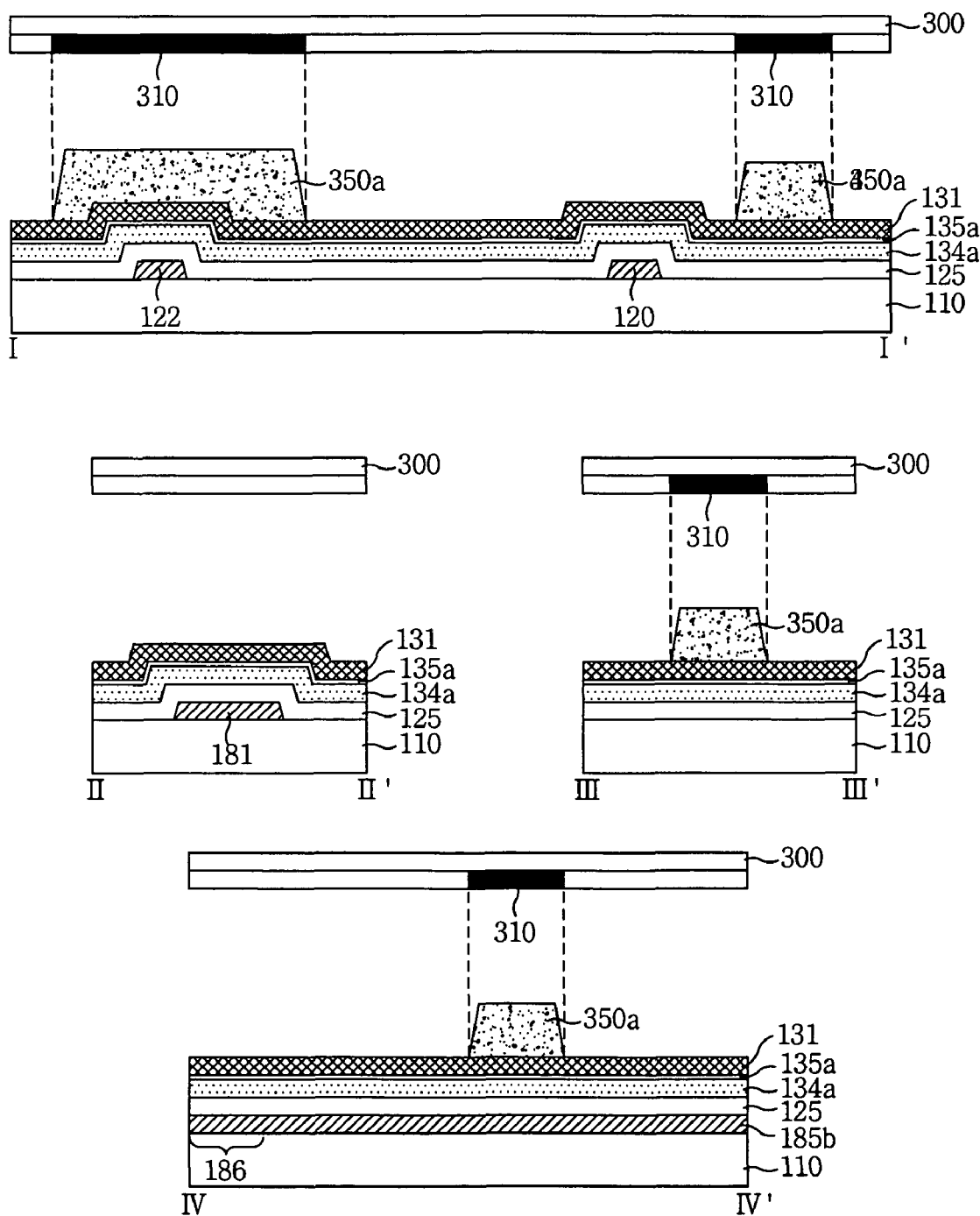

Referring to FIG. 8B, after a photo-resist is entirely coated on the data metal layer 131, the photolithography process using a third mask 300 as a diffractive exposure mask is carried out to form a photo-resist pattern 350a that exposes the data metal layer 131.

Figure 8C:
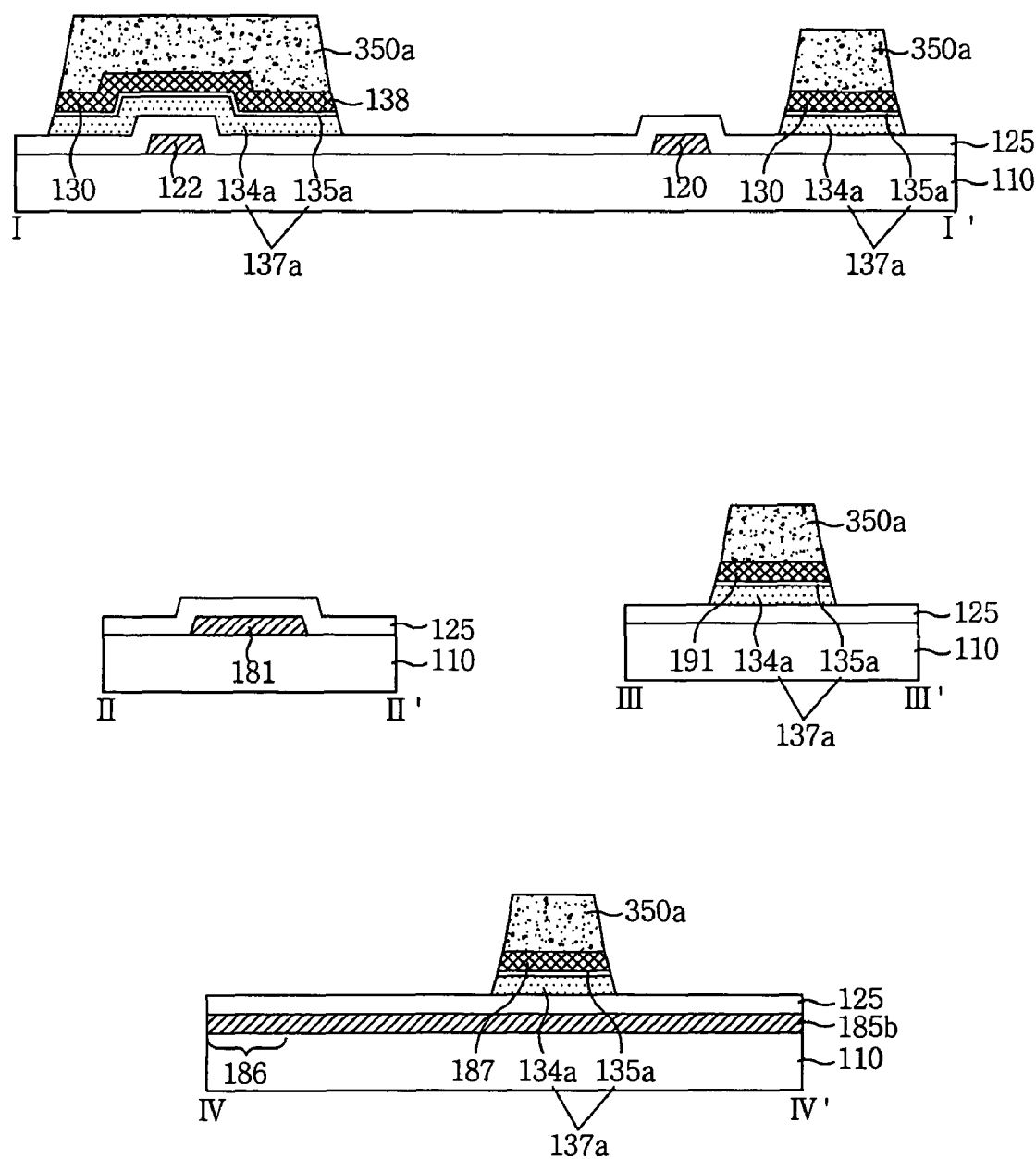

As shown in FIG. 8C, after the photo-resist pattern 350a is formed on the data metal layer 131, the data metal layer 131 exposed by the photo-resist pattern 350 is removed by the wet-etching.

Figure 8D:
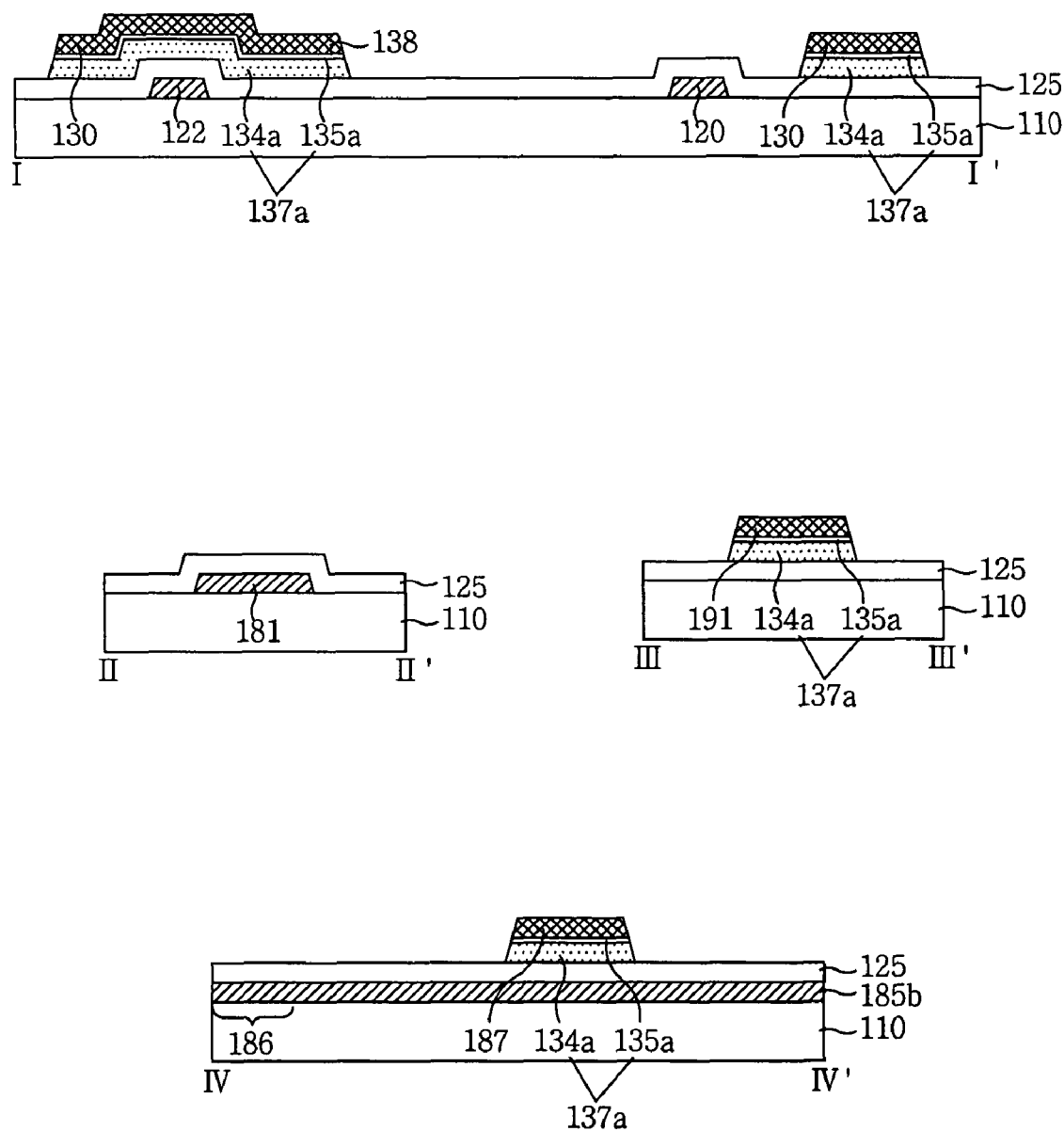

As shown in FIG. 8D, the photo-resist pattern 350a left on the data metal layer 131 is removed by the stripping process to form semiconductor pattern 137a for forming a channel of the thin film transistor 140 and a second conductive pattern including the data line 130, the source/drain pattern for forming the source electrode and the drain electrode, the lower data pad electrode 191 connected to the data line 130, the data shorting bar 194 connected to the data shorting line 195 extended from the lower data pad electrode 191 and the second gate shorting bar 187.

The data shoring line 195 that is electrically connected to the data shorting bar 194 is comprised of the odd and the even shorting lines 195a and 195b.

The second shorting bar 187 simultaneously formed along with the second conductive pattern is formed to cross with the gate shorting lines 185a and 185b with the gate insulating film 125 therebetween, and is electrically connected, via the fourth contact hole 154 formed the following protective film 150, to the even shorting line 185b.

Figure 9A:
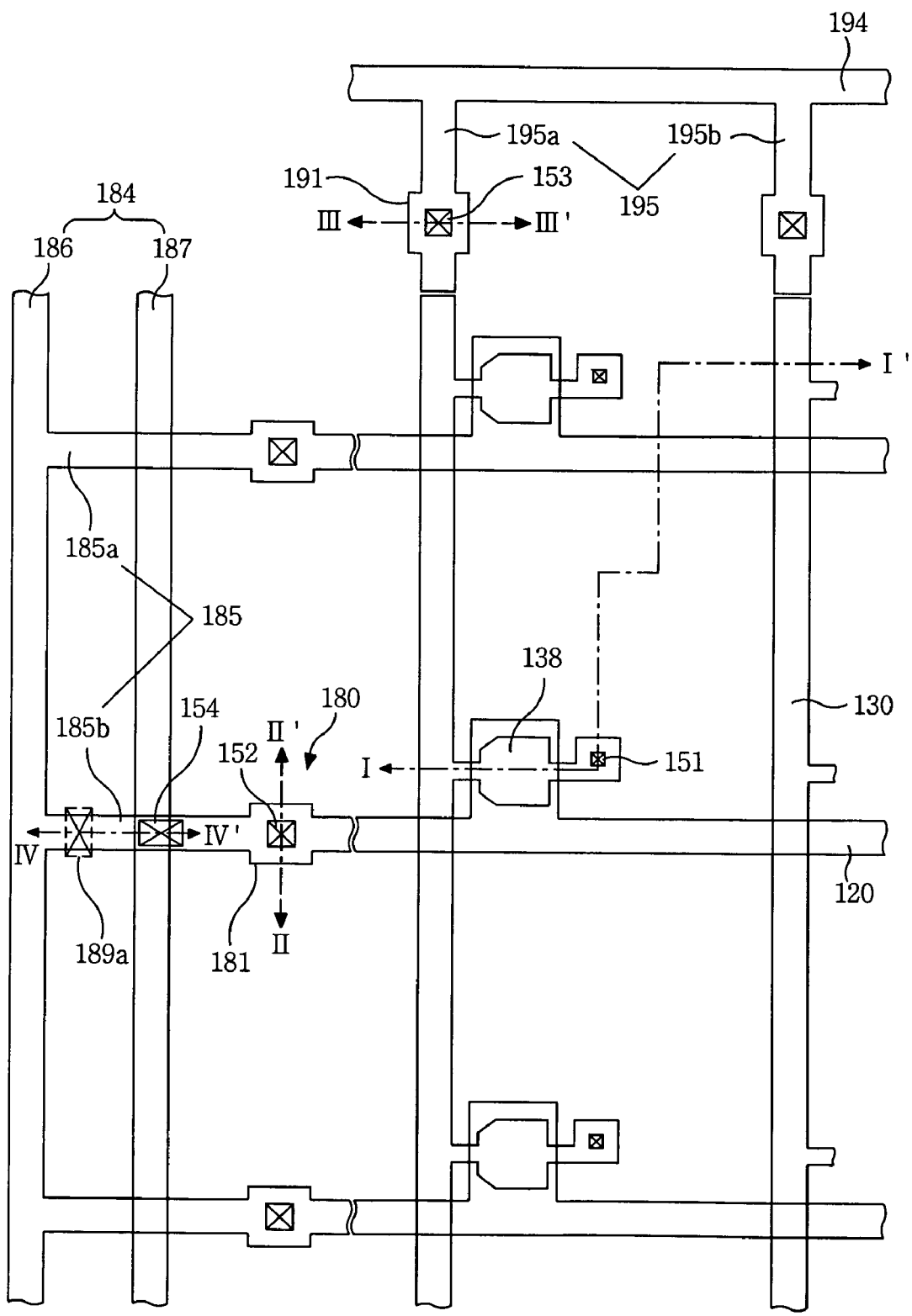
FIG. 9A and FIG. 9B are a plan view and a sectional view that show a thin film transistor substrate provided with a protective film.
Figure 9B:
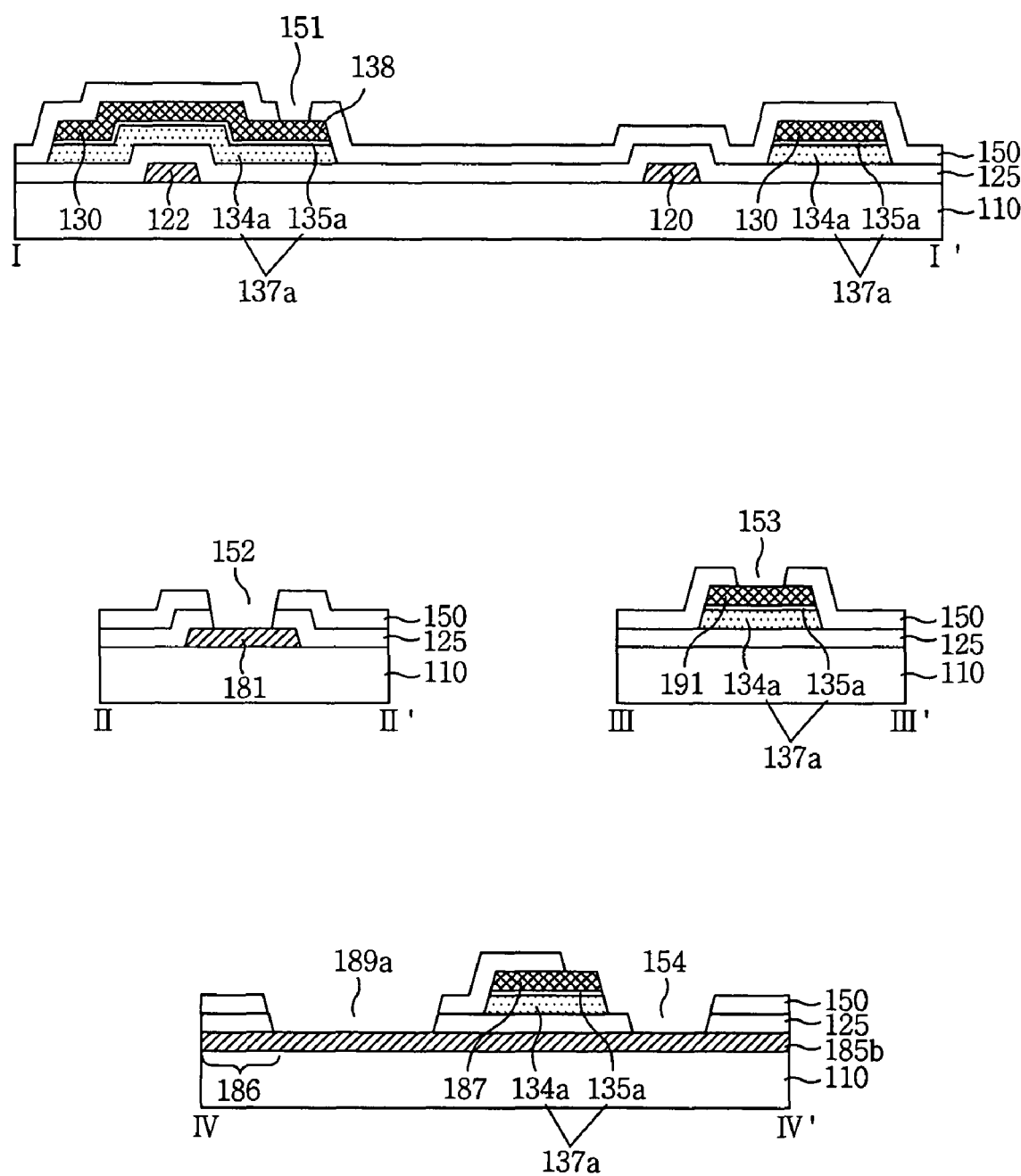

After the second conductive pattern is formed, referring to FIG. 9A and FIG. 9B, the protective film 150 including a plurality of contact holes 151, 152, 153 and 154, and a open hole area 189a is formed by the third mask process.

Figure 10A:
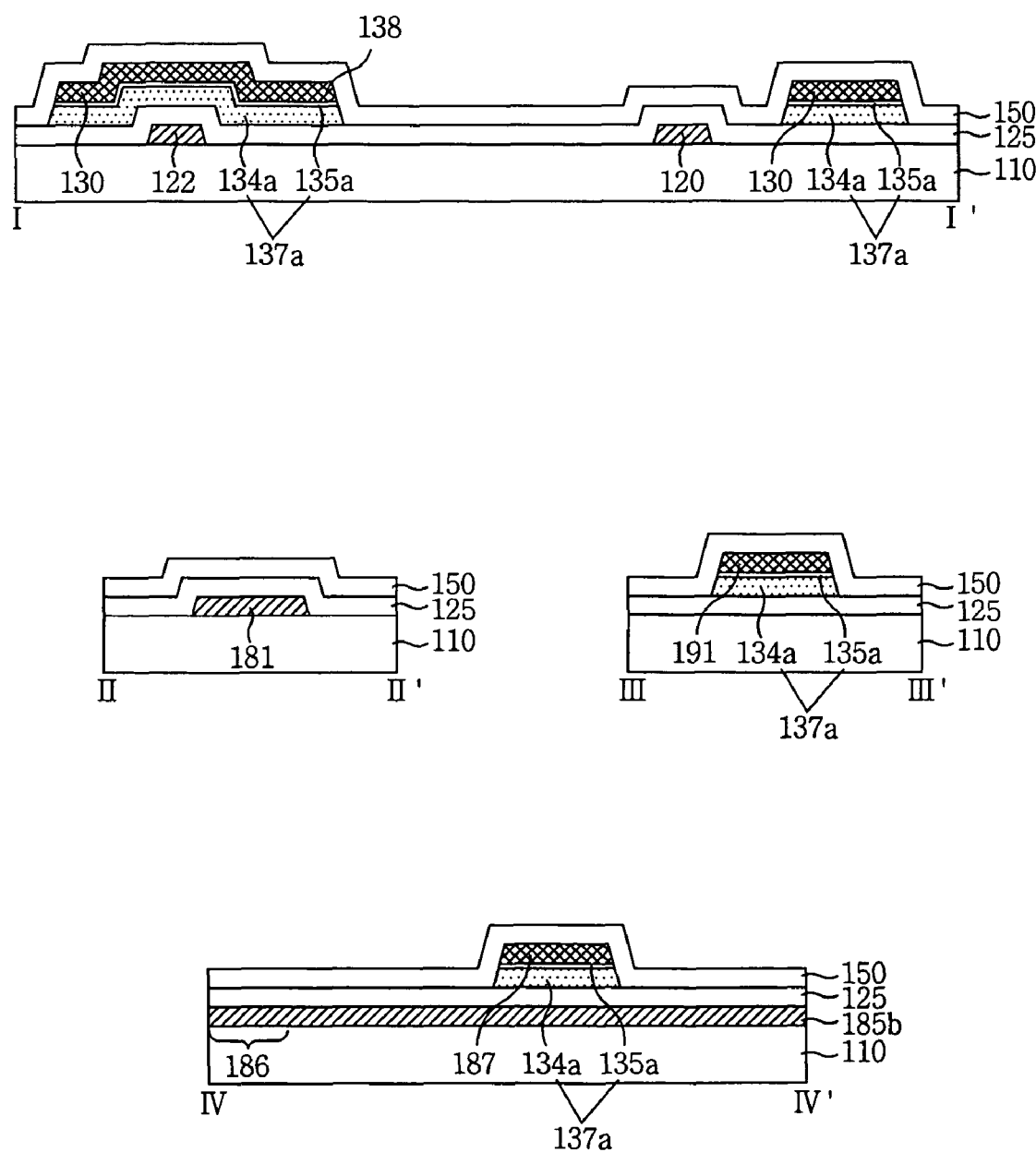
FIG. 10A to FIG. 10D are manufacturing flow charts that show the thin film transistor substrate provided with the protective film.

As shown in FIG. 10a, the protective film 150 is entirely disposed on the gate insulating film 125 provided with the second conductive pattern.

Figure 10B:
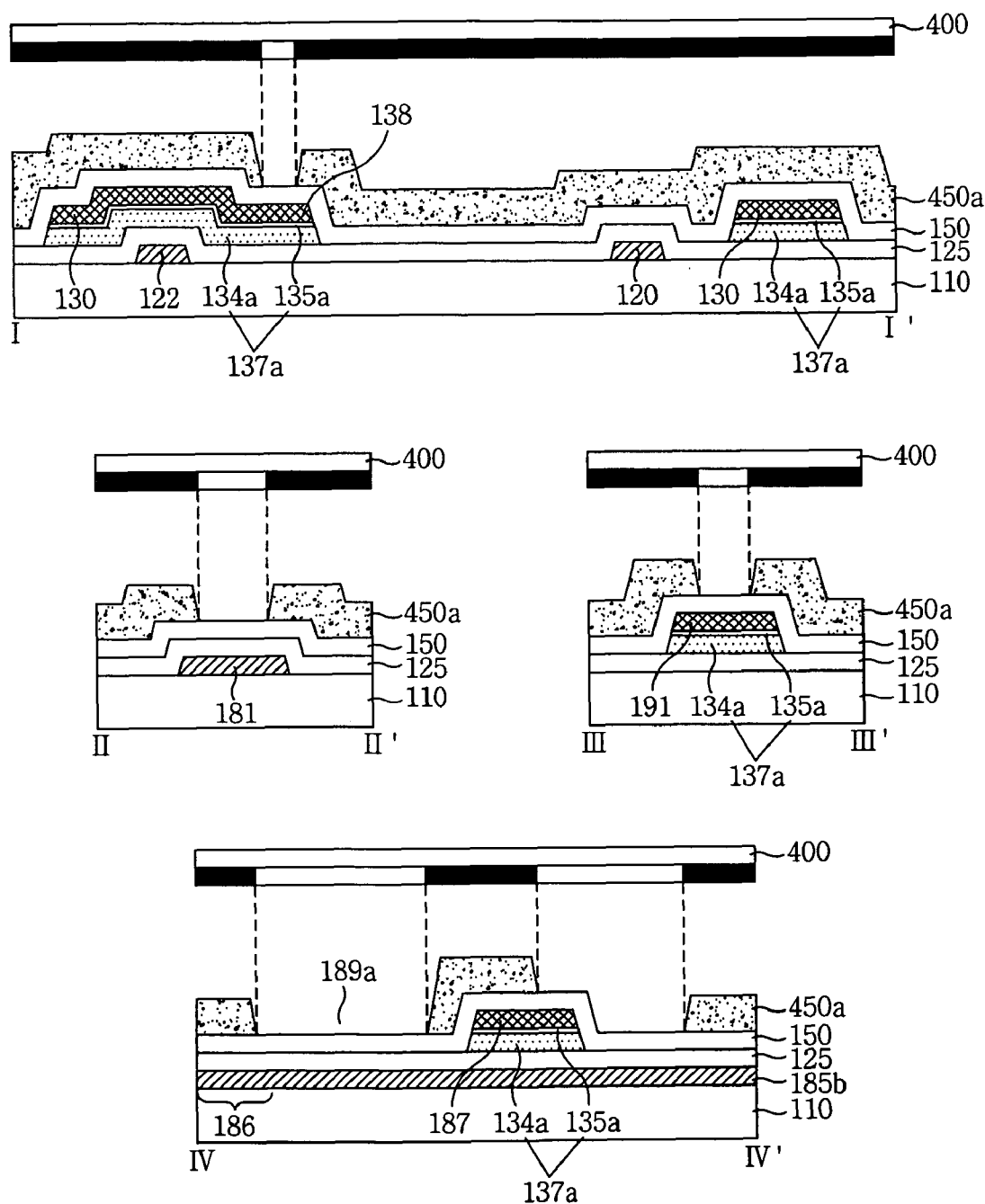
Figure 10C:
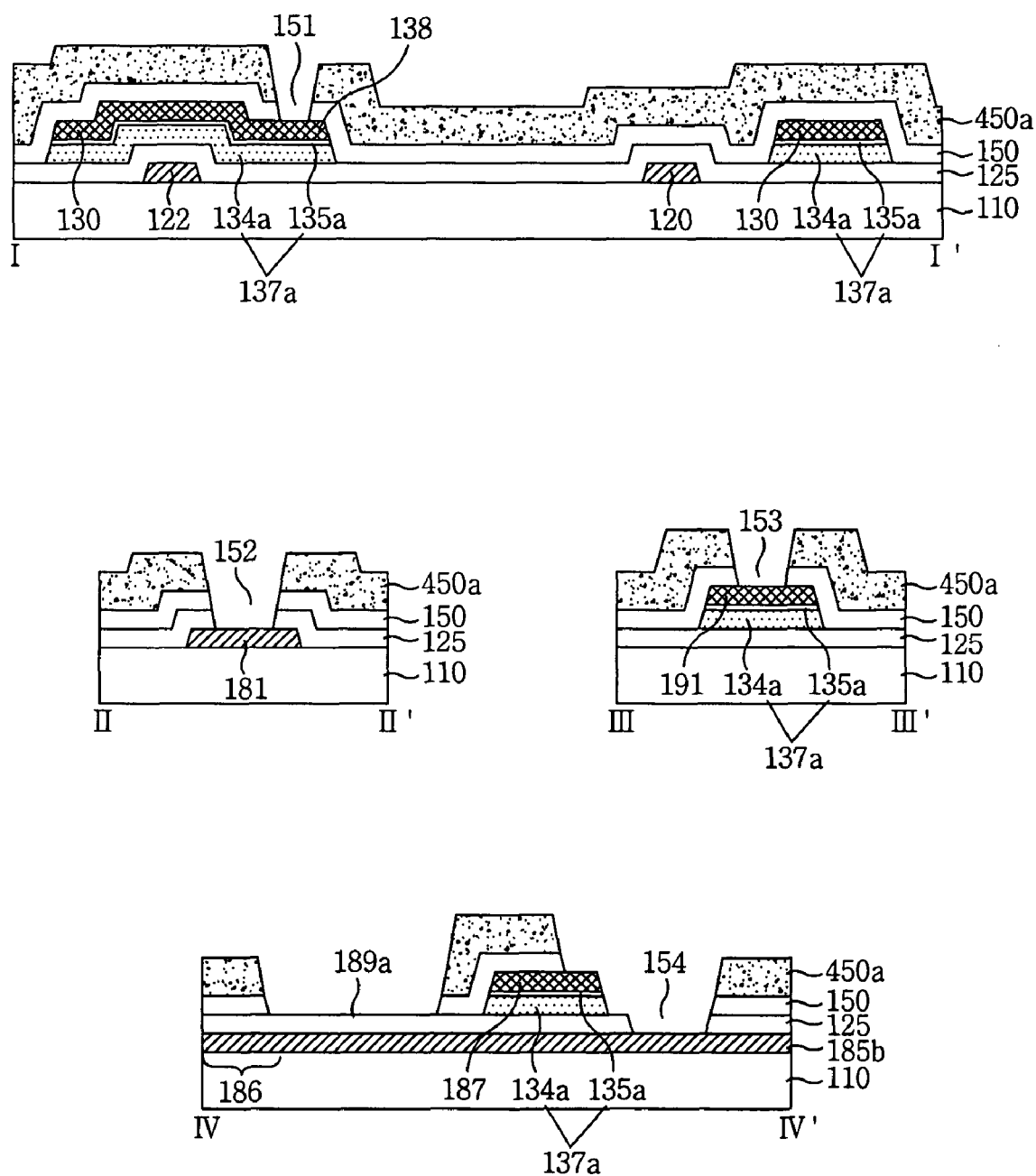

As shown in FIG. 10B, after the photo-resist is entirely coated on the protective film 150, the photolithography process using a third mask 300 is carried out to form a photo-resist pattern 450a on the protective film 150. As shown in FIG. 10C, an dry-etching about the protective film 125 opened by the photo-resist pattern 450a is carried out to form the first to the fourth contact holes 151, 152, 153 and 154 and open hole area (189a). The open hole separates the even gate shorting line 185b and the first gate shorting bar 186 on the protective film 125.

Figure 10D:
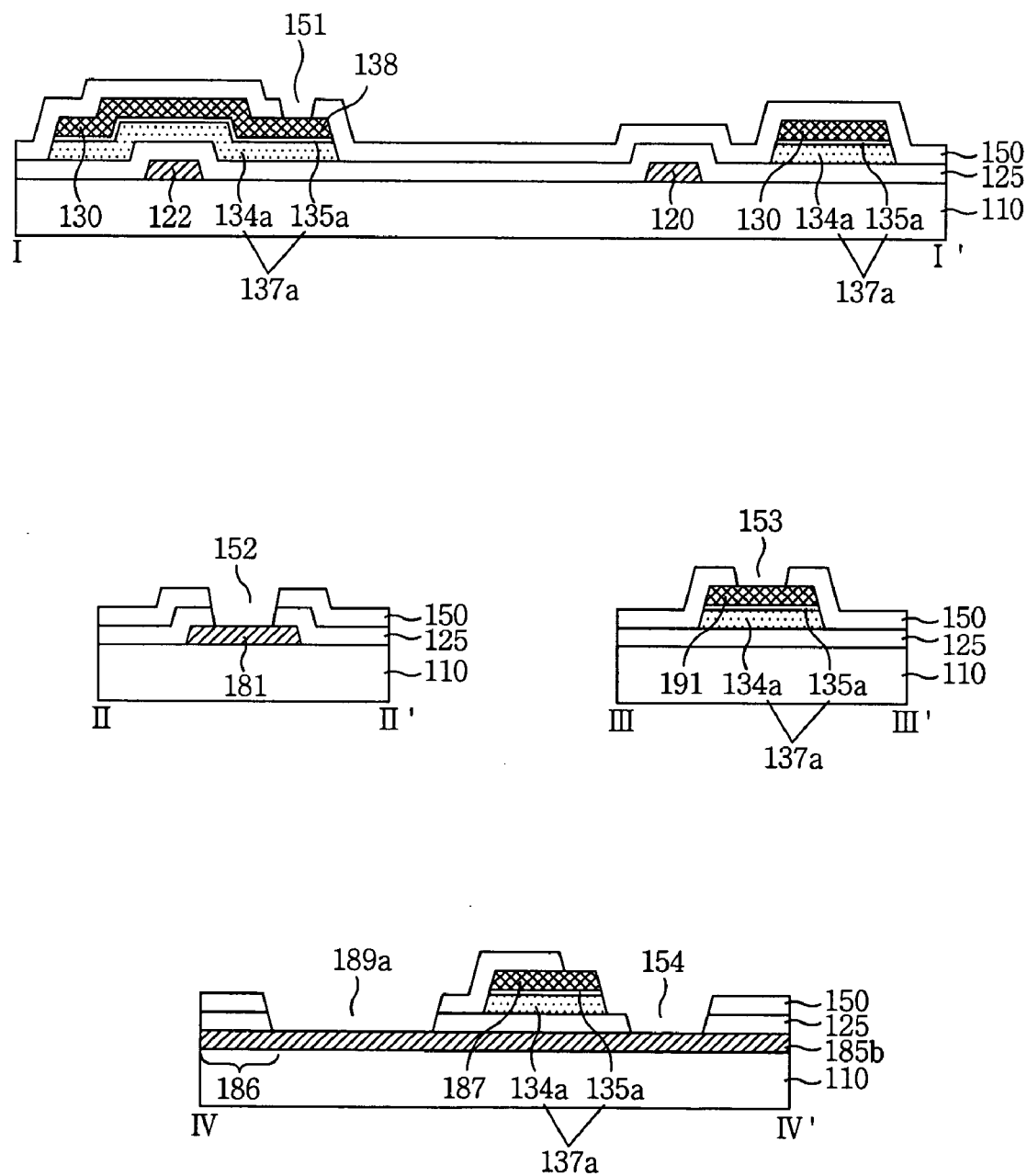

As shown in FIG. 10D, the photo-resist pattern 450a left on the protective film 150 is removed by the stripping process.

The first contact hole 151 formed on the protective film 150 passes through the protective film 150 to expose the drain electrode 138. The second contact hole 152 formed on the protective film 150 passes through the protective film 150 and the gate insulating film 125 to expose the lower gate pad electrode 181. The third contact hole 153 formed on the protective film 150 passes through the protective film 150 to expose the lower data pad electrode 191. The fourth contact hole 154 formed on the protective film 150 passes through the protective film 150 and the gate insulating film 125 to expose a gate shorting line 185, that is, the even gate shorting line 185b electrically connected, via the fourth contact hole 154, to the second gate shorting bar 187.

The open hole area 189a formed on the protective film 125 passes through the protective film 150 and the gate insulating film 125 to expose the gate shorting line 185 separated with the first gate shorting bar 186, that is, the even gate shorting line 185b electrically connected, via the fourth contact hole 154, to the second gate shorting bar 187.

Figure 11A:
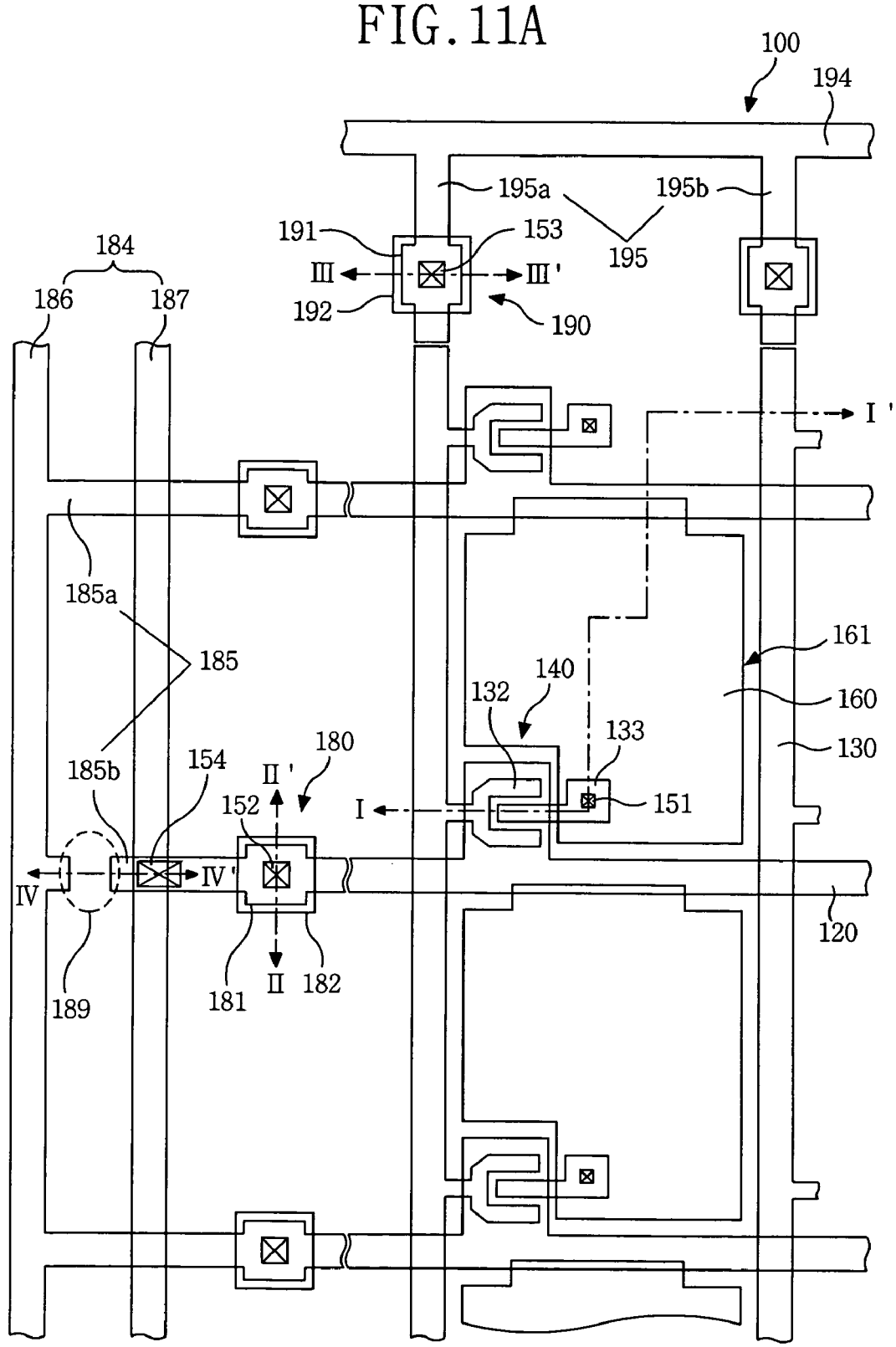
FIG. 11A and FIG. 11B are a plan view and a sectional view that show a thin film transistor substrate provided with a third conductive pattern.
Figure 11B:
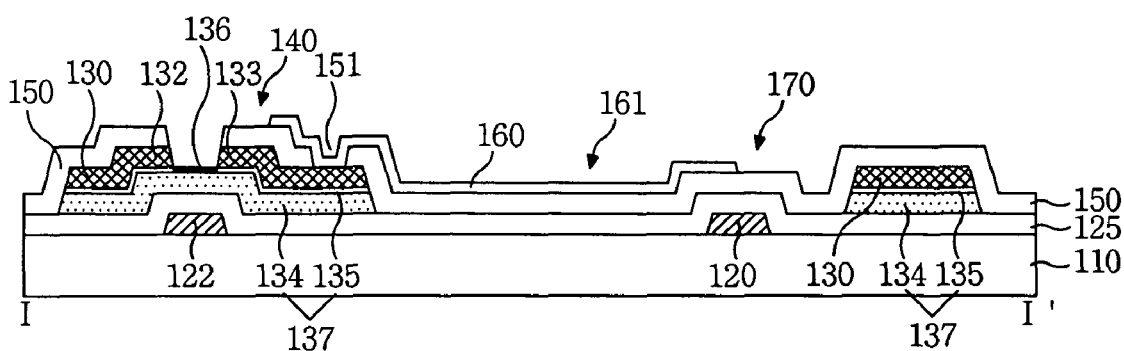
Figure 11B:
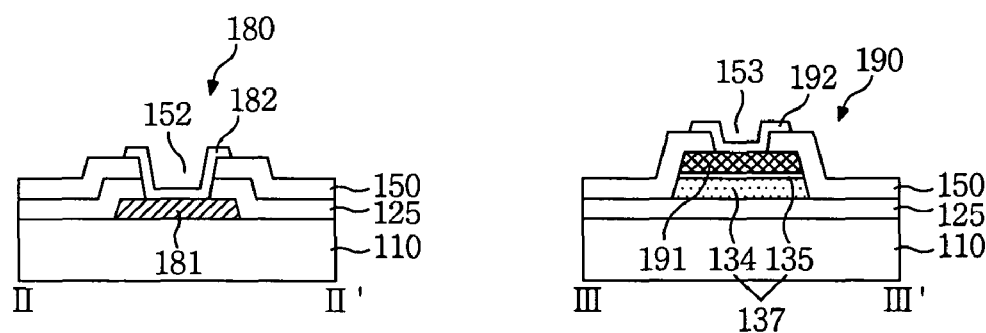
Figure 11B:
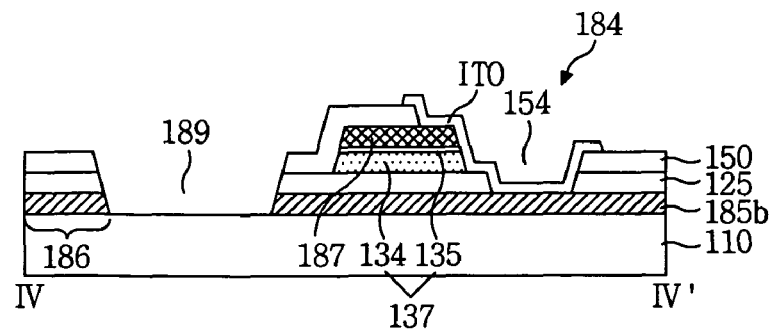

After a contact hole and the open hole is formed on the protective film, referring to FIG. 11A and FIG. 11B, the open hole 189 for separating the gate shorting line, a semiconductor pattern that forms a channel. The third conductive pattern includes the pixel electrode 160, the source electrode 132 connected to the data line 130, the drain electrode 133 opposed to the source electrode 132 with the channel therebetween, the upper gate pad electrode 192 and the upper data pad electrode 193.

Figure 12A:
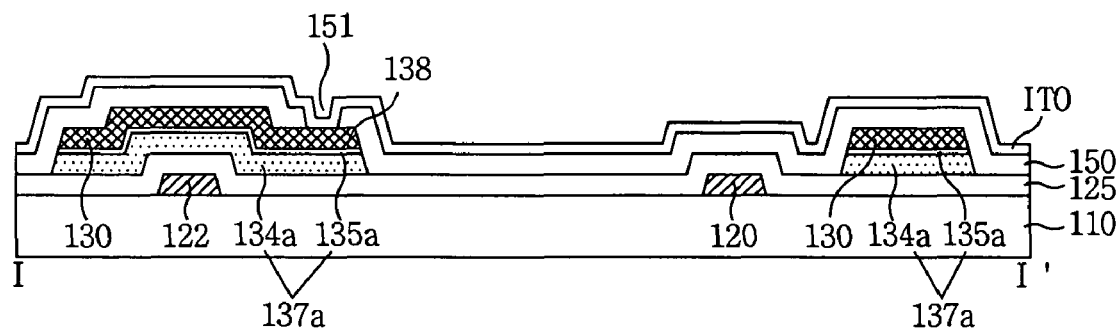
FIG. 12A to FIG. 12F are manufacturing flow charts that show the thin film transistor substrate provided with the third conductive pattern.
Figure 12A:
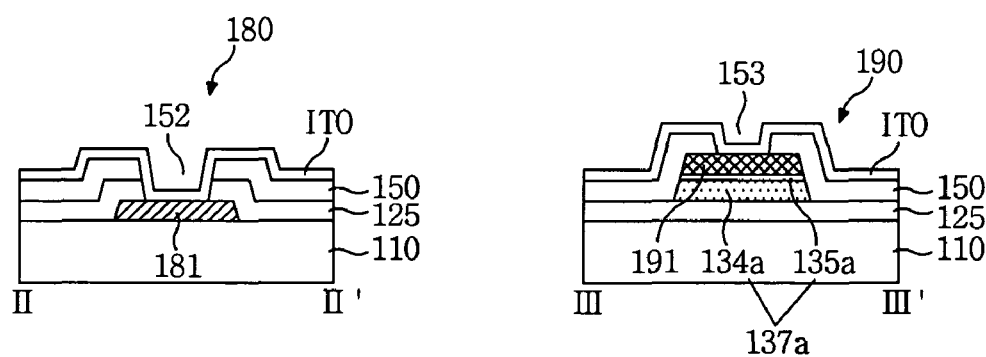
Figure 12A:
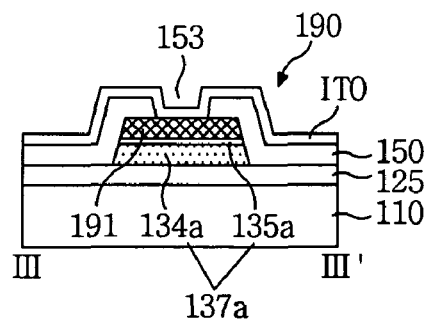
Figure 12A:
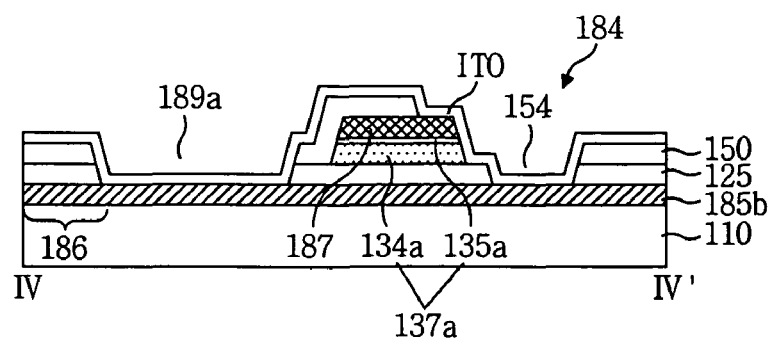

As shown in FIG. 12A, the transparent conductive layer ITO is entirely disposed on the protective film 150 provided with the plurality of the contact holes 151, 152, 153 and 154, and the open hole area 189a.

Figure 12B:
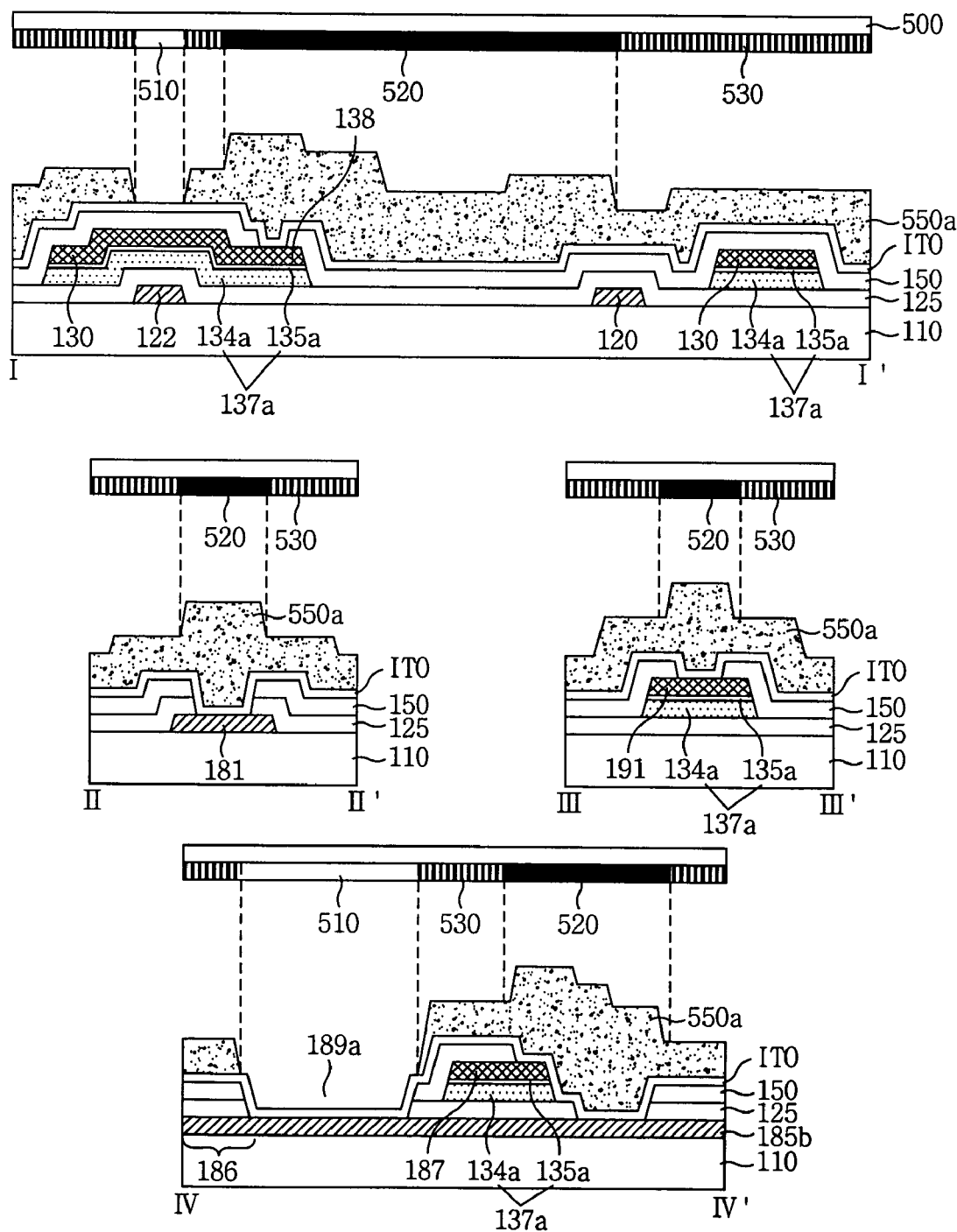

As shown in FIG. 12B, after the photo-resist is entirely coated on the transparent conductive layer ITO, the photolithography process using a fourth mask 500 is carried out to form a photo-resist pattern 550a having a step coverage on the transparent conductive layer ITO.

A transmitting portion 510 is formed at a channel area and at the open hole area 189a. A shielding portion 520 is formed an area to be formed the third conductive pattern by using the fourth mask 500. A diffractive exposure mask forms a diffractive portion 530 is used at another area.

Figure 12C:
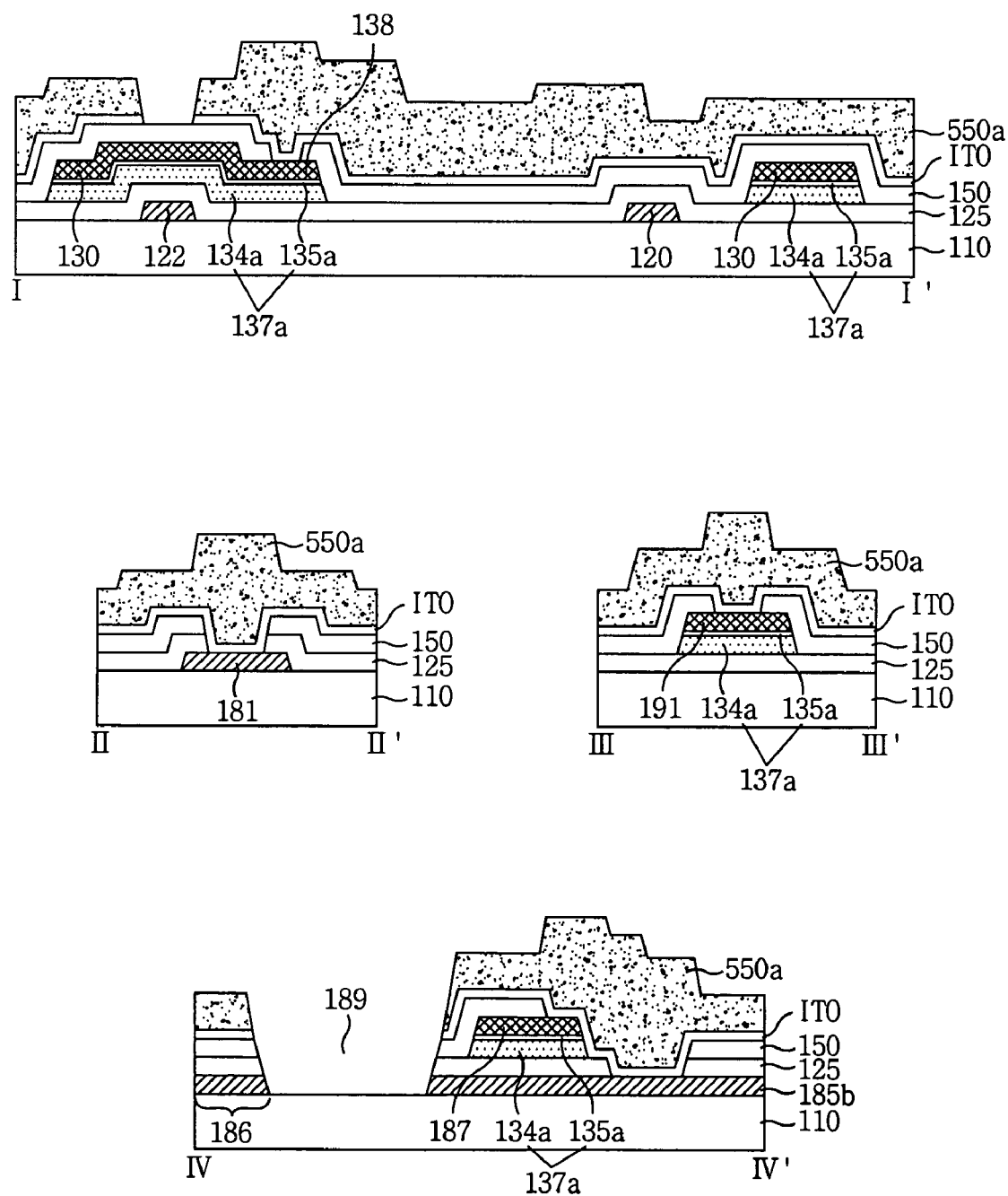

Referring to FIG. 12C, after the photo-resist pattern 550a provided with the step coverage is formed on the conductive metal layer ITO. The transparent conductive layer ITO is exposed by the photo-resist pattern 550, that is, the transparent conductive layer ITO formed at the channel area of the thin film transistor 140 and the open hole area 189a are removed by an etching process using an OZ Acid.

The transparent conductive layer ITO formed at the open hole area 189a is removed by the etching process to form the gate shorting line 185 exposed by the open hole area 189a, that is, a mixed acid shower about the even gate shorting line 185b is carried out to form the open hole 189 for separating the even gate shorting line from the first gate shorting bar 186.

The even gate shorting line 185b is shorted with the first gate shorting bar 186, and is electrically connected, via the fourth contact hole 154 formed on the protective film 150, to the second gate shorting bar 187.

In other words, the odd and the even shorting line 185a and 185b are electrically connected in a disconnected state to the first and second gate shorting bars 186 and 187, so that the lightening inspection about the gate line 120 is carried out in a real time before the liquid crystal display panel is finally completed.

Figure 12D:
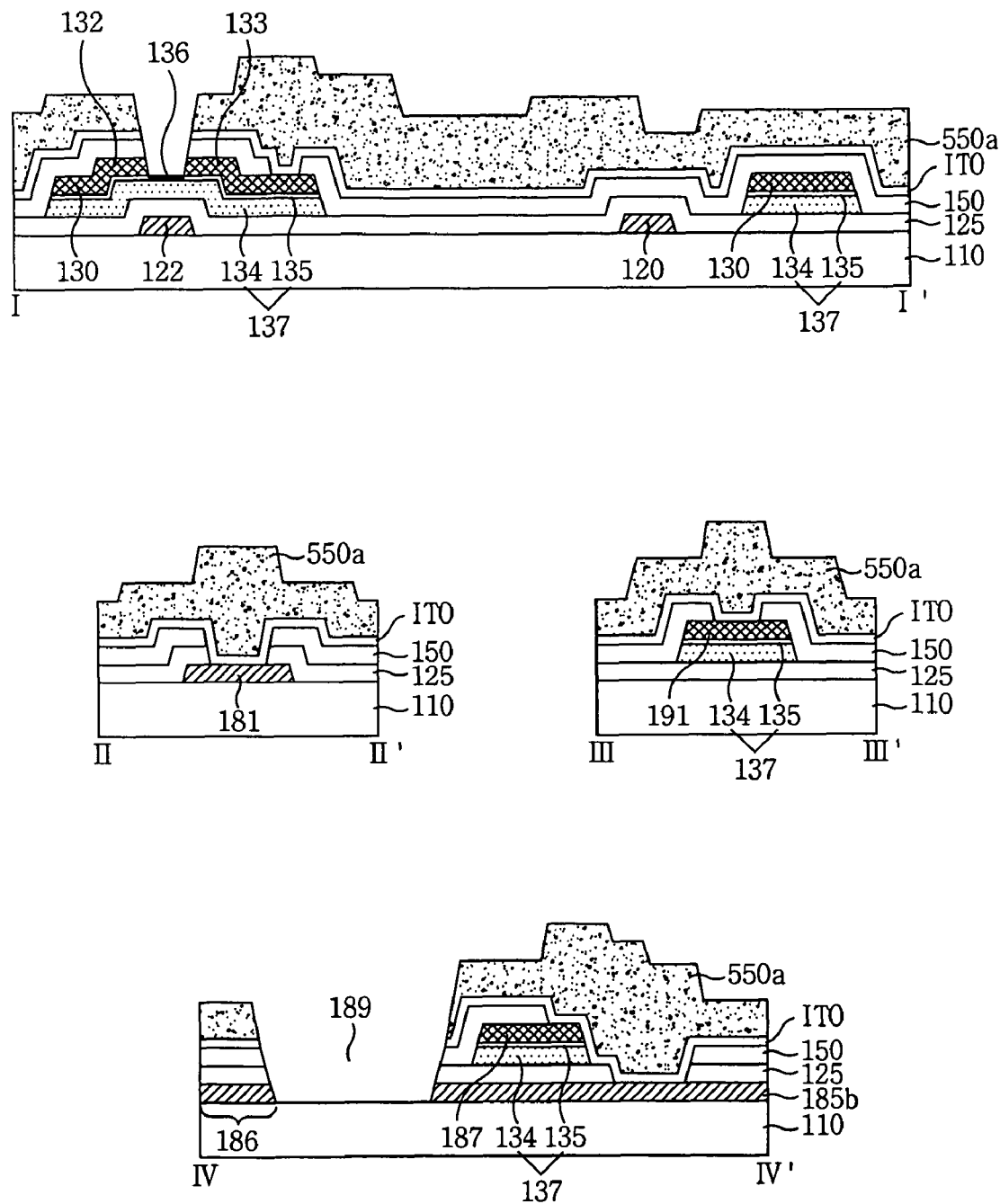

The transparent conductive layer ITO formed at the channel area of the thin film transistor 140 is etched to dry-etch the exposed protective film 150, the amorphous silicon layer 134a, the amorphous silicon layer 135a doped with an n+ impurity. As shown in FIG. 12D, the active layer 134 that forms a channel, a semiconductor pattern 137 formed of the ohmic contact layer 135, the data line 130, the source electrode 132 connected to the data line 130 and the drain electrode 133 opposed to the source electrode 132 with having the channel therebetween.

A channel protective film 136 protects the channel from the exterior environment at the channel area of the thin film transistor 140 among the ashing process using $O_2$ plasma.

Figure 12E:
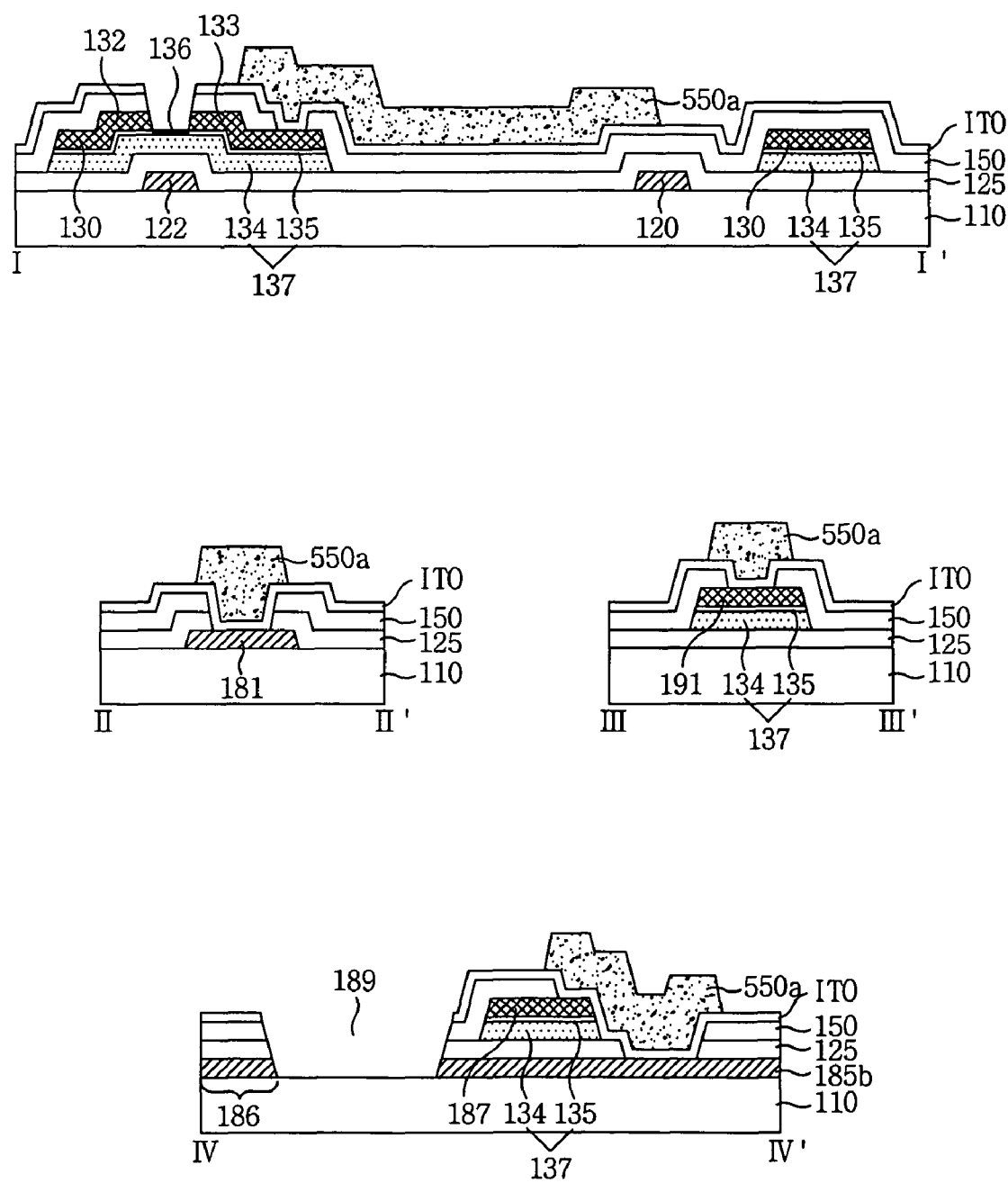
Figure 12F:
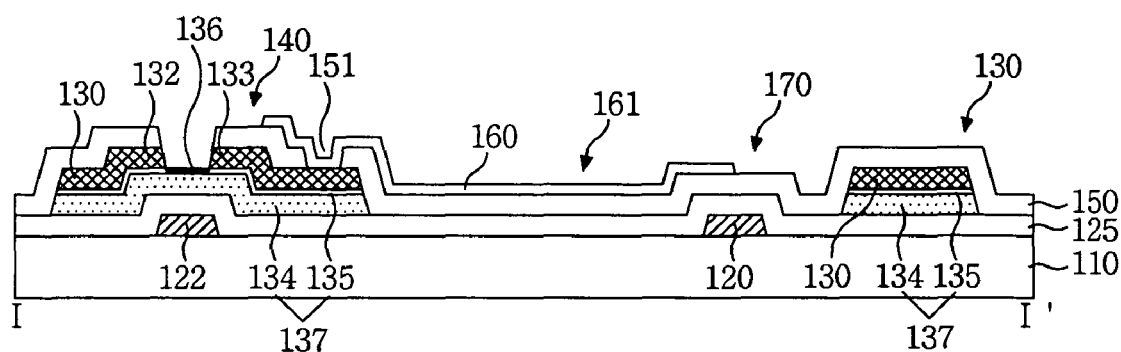
Figure 12F:
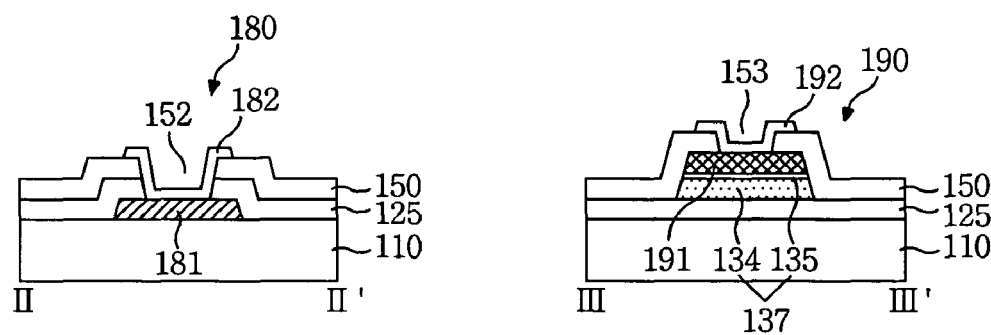
Figure 12F:
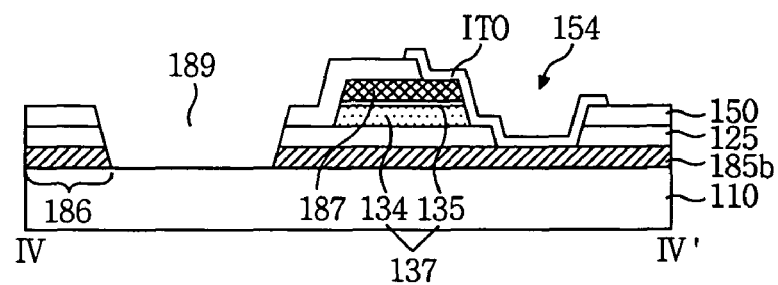

As shown in FIG. 12E, the ashing process about the photo-resist pattern 550a formed on the transparent conductive layer ITO is carried out to expose the pixel electrode 160 forms the third conductive pattern, the upper gate pad electrode 182, and the transparent conductive layer ITO formed other than an area to be formed the upper data pad electrode 192 and the fourth contact hole 154 of the protective film 150. As shown in FIG. 12F, after the transparent conductive layer ITO exposed by the photo-resist pattern 550a is etched, the stripping process about the left photo-resist pattern 550a is carried out to form the pixel electrode 160, the upper gate pad electrode 182 and the upper data pad electrode 192.

The pixel electrode 160 is connected, via the first contact hole 151 passing through the protective film 150, to the drain electrode 133 of the thin film transistor 140 to form an electric field for aligning the liquid crystal along with the common electrode. The pixel electrode 160 is formed in such a manner to overlap with the gate line 120 with the gate insulating film 125 and the protective film 150 therebetween to form the storage capacitor 170.

The upper gate pad electrode 182 is connected, via the second contact hole 152 passing through the protective film 150 and the gate insulating film 125, to the upper gate pad electrode 182. The upper gate pad electrode 182 is formed in a protruded image on the gate pad 180.

The upper data pad electrode 192 is connected, via the third contact hole 153 passing through the protective film 150, to the lower data pad electrode 192. The upper gate pad electrode 192 is formed in a protruded image on the gate pad 190.

The transparent conductive layer ITO formed at the fourth contact hole 154 of the protective film 150 contacts the even shorting line 185b separated from the first gate shorting bar 186 by the open hole 189 to the second gate shorting bar 187.

The gate shorting line connected to the gate shorting bar used during a lightening inspection of the gate line is divided into the even and the odd gate shorting line, so that a lightening inspection about the gate line formed on a substrate is carried out in a real time.

Although embodiments shown in the drawings have been described above, it should be understood to the ordinary skilled person in the art that the invention is not limited to the embodiments, but rather that various changes or modifications thereof are possible. Accordingly, the scope of the invention shall be determined only by the appended claims and their equivalents.

What is claimed is:

1. A thin film transistor substrate having gate shorting line and gate shorting bar connection, comprising:
   a gate lines formed on a substrate;
   a data lines intersect the gate lines with a gate insulating film there-between;
   a thin film transistor formed at the intersection of the gate lines and the data lines;
   a protective film that covers a thin film transistor formed on the gate insulating film;

a pixel electrode that is connected, via a first contact hole that passes through the protective film, to the thin film transistor;

a gate shorting bar connected to an odd and an even gate shorting line that extends from a gate pad connected to the gate line;

a data shorting bar connected to a data shorting line extended from a data pad connected to the data line; and an open hole that separates at least one of the odd and the even gate shorting lines from the gate shorting bar, wherein the gate shorting bar includes a first gate shorting bar connected to the odd gate shorting line that extends from the gate pad and a second gate shorting bar connected via a second contact hole and a transparent conductive layer formed on the second contact hole to the even gate shorting line;

wherein the even gate shorting line is separated from the first gate shorting bar by the open hole, wherein the data shorting line includes an odd and even data shorting line, wherein the first gate shorting bar is formed simultaneously on the substrate along with the odd and even gate shorting lines by a mask process using the same metal as the gate lines, wherein the second gate shorting bar is simultaneously formed along with the data lines and is formed to cross with the gate shorting lines with having the gate insulating film therebetween, wherein the data lines is formed in a crossed manner with the odd and even gate shorting line on a gate insulating film of the substrate by a mask process using the same metal as the data line, wherein the gate insulating film is located between the first gate shorting bar and the second gate shorting bar, wherein the second gate shorting bar is insulated from the odd gate shorting line by the gate insulating film and is connected to the even gate shorting line via the second contact hole passing through the protective film and the gate insulating film, wherein the thin film transistor includes a channel protective film to protect an active layer of the thin film transistor, wherein the open hole formed on the protective film passes through the protective film and the gate insulating film to expose the substrate and separates the even gate shorting line and the first gate shorting bar on the protective film.

2. The thin film transistor substrate having gate shorting line and gate shorting bar connection as claimed in claim 1, wherein the protective film includes:

the first contact hole that passes through the protective film to contact the drain electrode of the thin film transistor with the pixel electrode;

the second contact hole that passes through the protective film and the gate insulating film to contact the second gate shorting bar with the separated gate shorting line, a third contact hole that passes through the protective film and the gate insulating film to contact a lower electrode of the gate pad with an upper electrode; and a fourth contact hole that passes through the protective film to contact a lower electrode of the data pad with an upper electrode.

* * * * *